(12) United States Patent
Koh et al.

(10) Patent No.: US 6,933,569 B2
(45) Date of Patent: Aug. 23, 2005

(54) SOI MOSFET

(75) Inventors: Risho Koh, Tokyo (JP); Shigeharu Yamagami, Tokyo (JP); Jong-wook Lee, Tokyo (JP); Hitoshi Wakabayashi, Tokyo (JP); Yukishige Saito, Tokyo (JP); Atsushi Ogura, Tokyo (JP); Mitsuru Narihiro, Tokyo (JP); Kohichi Arai, Tokyo (JP); Hisashi Takemura, Tokyo (JP); Tohru Mogami, Tokyo (JP); Toyoji Yamamoto, Tokyo (JP); Yukinori Ochiai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/668,349

(22) Filed: Sep. 24, 2003

(65) Prior Publication Data

US 2004/0129975 A1 Jul. 8, 2004

(30) Foreign Application Priority Data

Dec. 6, 2002 (JP) ........................................ 2002-355416

(51) Int. Cl.⁷ ............................................... H01L 21/01
(52) U.S. Cl. ........................ 257/347; 257/348; 257/349
(58) Field of Search ................................. 257/347–348, 257/349–350, 351–354, 359, E27.112, E21.32, E21.545, E21.561, E21.564

(56) References Cited

U.S. PATENT DOCUMENTS

| | | | | | |
|---|---|---|---|---|---|
| 6,130,457 A | * | 10/2000 | Yu et al. | ...................... | 257/347 |
| 6,252,280 B1 | * | 6/2001 | Hirano | ........................ | 257/347 |
| 6,495,887 B1 | * | 12/2002 | Krishnan et al. | ........... | 257/347 |
| 6,534,807 B2 | * | 3/2003 | Mandelman et al. | ....... | 257/272 |
| 6,657,276 B1 | * | 12/2003 | Karlsson et al. | ........... | 257/510 |
| 6,693,333 B1 | * | 2/2004 | Yu | .............................. | 257/407 |

| | | | |
|---|---|---|---|
| 2002/0185687 A1 | | 12/2002 | Koh et al. |

FOREIGN PATENT DOCUMENTS

| | | | |
|---|---|---|---|
| JP | 4-34980 | A | 2/1992 |
| JP | 11-135795 | A | 5/1999 |
| JP | 2000-252471 | A | 9/2000 |
| JP | 2000-294794 | A | 10/2000 |
| JP | 2000-332250 | A | 11/2000 |
| JP | 2001-024202 | A | 1/2001 |
| JP | 2002-217420 | A | 8/2002 |
| WO | WO 03/023865 | A1 | 3/2003 |

OTHER PUBLICATIONS

Koh et al., "Body–Contacted SOI MOSFET Structure with Fully Bulk CMOS Compatible Layout and Process", *IEEE Electron Device Letters*, vol. 18, No. 3, Mar. 1997, pp. 102–104.

Chen et al., "Suppression of the SOI Floating–body Effects by Linked–body Device Structure", *1996 Symposium on VLSI Technology Digest of Technical Papers*, Jun. 11–13, 1996, pp. 92–93.

(Continued)

*Primary Examiner*—Long Pham
*Assistant Examiner*—Thao X. Le
(74) *Attorney, Agent, or Firm*—Sughrue Mion, PLLC

(57) ABSTRACT

A semiconductor device includes a semiconductor layer formed on an insulator, a gate insulating film formed on the semiconductor layer, a gate electrode formed on the gate insulating film and extending in a first direction, source/drain regions formed in the semiconductor layer on both sides of the gate electrode, a body contact region in the semiconductor layer, a partial isolating region in which a field insulating film thicker than the gate insulating film intervenes between the semiconductor layer and an extending portion of the gate electrode, and a full isolating region in which the semiconductor layer on the insulator is removed. The full isolating region is formed to be in contact with at least a part of a side parallel to the first direction of the source/drain regions.

17 Claims, 32 Drawing Sheets

OTHER PUBLICATIONS

Maeda et al., "Impact of 0.18μm SOI CMOS Technology using Hybrid Trench Isolation with High Resistivity Substrate on Embedded RF/Analog Applications", *2000 Symposium on VLSI Technology Digest of Technical Papers*, Jun. 13–15, 2000, pp. 154–155.

Yamagami et al., "Thin Film SOI–MOSFET with Body Contact Structure using Elevated Field Insulator", *The Japan Society of Applied Physics, The 63rd Autumn Meeting, 2002*, Sep. 24, 2002, pp. 801, with English translation.

* cited by examiner

SOI MOSFET

BACKGROUND OF THE INVENTION

1. Field of the Invention

The present invention relates to a semiconductor device and a method for manufacturing the same. More particularly, the present invention relates to a semiconductor device formed on an SOI (Silicon On Insulator) substrate and a method for manufacturing the same.

2. Description of the Related Art

FIGS. 1A and 1B show a conventional transistor on an SOI substrate (hereinafter, referred to as an SOI transistor) disclosed in Japanese Laid Open Patent Application (JP-P-Heisei 4-34980). FIG. 1A is a plan view of a structure of the conventional SOI transistor, and FIG. 1B is a cross sectional view along a dotted line X–X' in FIG. 1A.

In the conventional SOI transistor, an SOI substrate has a silicon substrate 101, an insulating film 102 on the silicon substrate 101, and a silicon layer 103 (hereinafter, referred to as an SOI layer) on the insulating film 102. An active region is formed in the SOI layer 103, which includes a channel region 108, a source region 109 and a drain region 110. A gate electrode 105 is formed on the SOI layer 103 through a gate insulating film 104. An isolation insulating film 106 is formed on the SOI layer 103 around the active region. A well region 111 is formed under the isolation insulating film 106, into which impurity with the same conductivity type as in the channel region 108 is introduced. A body contact 107 is formed on a predetermined area of the well region 111 to penetrate the isolation insulating film 106. Contact holes 113 are formed in the interlayer insulating film 112 to reach the source and drain regions 109 and 110. Wiring layers 114 are formed to fill the contact holes 113. A wiring layer 115 is formed on the body contact 107 to electrically connect to the well region 111. This structure is characterized in that excess carriers in the channel region 108 can escape out of the SOI transistor through the well region 111, resulting in suppression of the floating body effects. Such a path through which excess carriers can escape from the channel region 108 is referred to as a "carrier path", hereinafter.

A method of forming the isolation insulating film 106 is not disclosed in the JP-P-Heisei 4-34980. The isolation insulating film 106 may be formed by using a conventional method which have been generally adopted in a FET (Field Effect) transistor on a bulk substrate, as shown in FIGS. 2A to 2C. First, impurity is introduced into the SOI layer 103 (FIG. 2A). Next, the isolation insulating film 106 is formed on the SOI layer 103 through a thermal oxidation process or a CVD (Chemical Vapor Deposition) process (FIG. 2B). After that, a part of the isolation insulating film 106 is etched through a wet etching process to form the structure shown in FIG. 2C. The active region is to be formed under the region where the isolation insulating film 106 is removed. The carrier path is formed under the remaining isolation insulating film 106. In this case, therefore, it is impossible to introduce impurity into the carrier path with higher density than in the channel region.

FIGS. 3A to 3C show another method of forming the isolation insulating film 106 in FIG. 1B. A mask pattern such as a photo resist or a $SiO_2$ film is formed on a predetermined area of the SOI layer 103, and then impurity is introduced into the SOI layer 103 (FIG. 3A). After the mask pattern is removed, the isolation insulating film 106 is formed on the SOI layer 103 (FIG. 3B). Next, a part of the isolation insulating film 106 is etched (FIG. 3C). In this case, an edge of the active region deviates from an edge of the carrier path as shown in FIG. 3C, i.e., the edge of the active region can not be located to self-align with the edge of the carrier path.

FIG. 4 is a cross sectional view showing a structure of another conventional SOI transistor disclosed in IEEE, Electron Device Letter, Vol. 18, pp. 102–104. In the conventional SOI transistor, an SOI substrate has a silicon substrate 130, an insulating film 121 on the silicon substrate 130, and an SOI layer 122 on the insulating film 121. An active region is formed in the SOI layer 122, which includes a source region 124 and a drain region 123. A gate electrode 125 is formed on the SOI layer 122 through a gate insulating film 126. An isolation insulating film 129 (hereinafter, referred to as a LOCOS region) is formed adjacent to the active region by a LOCOS (Local Oxidation of Silicon) method. A carrier path 127 is formed in a residue semiconductor layer under the LOCOS region 129. A body contact region 128 is connected to the carrier path 127. Excess carriers can escape out of the SOI transistor through the carrier path 127, resulting in suppression of the floating body effects.

Other conventional SOI transistors similar to the transistor shown in FIG. 4 are disclosed in the Symposium on VLSI Technology 1996, pp. 92–93, and Japanese Laid Open Patent Application (JP-P2000-294794A). In the other conventional transistor disclosed in JP-P2000-204794A, a full isolating trench is also provided next to the active region to reach the insulating film 121. In these conventional transistors mentioned above, as shown in FIG. 4, the carrier path 127 is formed under the LOCOS region 129, i.e. in the residue semiconductor layer. Therefore, thickness of the SOI layer 122 around the carrier path 127 becomes thinner than that in the active region.

FIG. 5 is a cross sectional view showing a structure of still another conventional SOI transistor disclosed in the Symposium on VLSI Technology 2000, pp. 154–155. In the conventional SOI transistor, an SOI substrate has a silicon substrate 130, an insulating film 121 on the silicon substrate 130, and an SOI layer 122 on the insulating film 121. An active region is formed in the SOI layer 122, which includes a source region 124 and a drain region 123. A gate electrode 125 is formed on the SOI layer 122 through a gate insulating film 126. Isolating trenches 131 and 132 exist in the SOI layer 122 around the active region, which are formed through an STI (Shallow Trench Isolation) process. The isolating trench 131 adjacent to the active region (hereinafter, referred to as a partial STI) does not reach the insulating film 121. A carrier path 127 is formed in a residue semiconductor layer under the partial STI 131. A body contact region 128 is connected to the carrier path 127. Excess carriers can escape out of the SOI transistor through the carrier path 127, resulting in suppression of the floating body effects.

Another conventional SOI transistor similar to the transistor shown in FIG. 5 is disclosed in Japanese Laid Open Patent Application (JP-P2002-217420A). In these conventional transistors mentioned above, as shown in FIG. 5, the carrier path 127 is formed under the partial STI 131, i.e. in the residue semiconductor layer. Therefore, thickness of the SOI layer 122 around the carrier path 127 becomes thinner than that in the active region.

When an SOI transistor such as a full-depletion SOI MOSFET (Metal Oxide Semiconductor Field Effect Transistor) is designed to have a very thin SOI layer (typically 10 to 50 nm thickness), a carrier path in the SOI transistor also becomes very thin and hence resistivity of the carrier path increases. Therefore, it is necessary to increase impurity density in the carrier path more than that in the channel region of the SOI transistor. Also, it is preferable to locate the edge of the carrier path self-aligned with the edge of the active region of the SOI transistor. Moreover, when the carrier path is formed under a LOCOS region or a partial STI as in FIGS. 4 and 5, the carrier path becomes further thinner than the SOI layer. Such a carrier path is insufficient for avoiding the floating body effects. It is also preferable to make the carrier path applicable to an SOI transistor having an extremely thin SOI layer such as a full-depletion SOI MOSFET.

Also, when impurity density in the well region becomes too high in the conventional SOI transistor shown in FIGS. 1A and 1B, the strength of electric field between the source/drain region and the well region increases and hence leak current increases. Also, if the impurity density in the well region becomes high, a parasitic capacitance between the source/drain region and the well region increases, resulting in deterioration of operation speed of the SOI transistor. It is preferable to reduce the resistivity of the carrier path as possible with the leak current and the parasitic capacitance between the source/drain region and the well region being kept low.

Also, with regard to the processes shown in FIGS. 2C and 3C, when the isolation insulating film 106 is processed by a wet etching, the etching proceeds isotropically and hence the edge of the isolating insulating film 106 does not become steep. Also, the isolating insulating film 106 is etched horizontally due to the isotropic etching, which causes reduction of the area of the isolating insulating film 106. On the other hand, when the isolation insulating film 106 is processed by a dry etching, the surface of the SOI layer 103 where the active region is to be formed is exposed to plasmas used in the dry etching, which causes various defects. Moreover, there is a possibility that the SOI layer 103 is etched, because an etching selection rate of $SiO_2$ to silicon is lower in the dry etching than in the wet etching. A device isolation method is desired with which the edge of the isolation insulating film is formed to be steep and the SOI layer where the active region is to be formed is not etched during the device isolation process.

Also, in the conventional SOI transistor shown in FIGS. 1A and 1B, the surface of the isolation insulating film 106 is located upper than the surface of the SOI layer 103 where the active region is to be formed, as shown in FIGS. 2C and 3C. Therefore, deposition of material of the gate electrode 105 over the SOI substrate results in a concavo-convex surface of the material layer. If the surface of the material layer is not flat when forming the gate electrode 105, the resist pattern and hence the formed gate electrode 105 would be deformed. Also, if the top and bottom surfaces of the material layer are not flat when forming the gate electrode 105 through an etching process such as an RIE (Reactive Ion Etching), the etching of a part of the material layer would finish earlier than the other part of the material layer, resulting in exposure of the gate insulating film 104. If the etching is continued to remove the remaining material layer, the exposed gate insulating film 104 and moreover the SOI layer would be etched. Thus, the structure of the SOI transistor can not be achieved. A method is desired with which the top and bottom surfaces of the material layer for the gate electrode can be formed to be planar so that deformation of the gate electrode is not caused in the etching process.

SUMMARY OF THE INVENTION

Therefore, an object of the present invention is to provide a semiconductor device having an SOI transistor and a method for manufacturing the same, in which a carrier path is thick enough to avoid the floating body effects even in the case of a very thin SOI layer.

Another object of the present invention is to provide a semiconductor device having an SOI transistor and a method for manufacturing the same, in which resistivity of the carrier path is reduced, while leak current and parasitic capacitance between the carrier path and the source/drain regions of the SOI transistor are kept low.

Still another object of the present invention is to provide a method for manufacturing a semiconductor device having an SOI transistor, in which impurity density in the carrier path can be made higher than that in a channel region of the SOI transistor, and an edge of the carrier path can be formed to self-align with an edge of an active region of the SOI transistor.

Still another object of the present invention is to provide a method for manufacturing a semiconductor device having an SOI transistor, in which the SOI layer where the active region is to be formed is not etched during a device isolation process, and an edge of an isolation insulating film is formed to be steep and self-align with the edge of the active region.

Still another object of the present invention is to provide a method for manufacturing a semiconductor device having an SOI transistor, in which top and bottom surfaces of a material layer for a gate electrode are formed to be planar.

In an aspect of the present invention, a semiconductor device includes: a field effect transistor having a semiconductor layer formed on an insulator, a gate insulating film formed on the semiconductor layer, a gate electrode formed on the gate insulating film and extending in a first direction, and source/drain regions formed in the semiconductor layer on both sides of the gate electrode by heavily introducing a first conductivity type impurity; a body contact region in which a second conductivity type impurity is heavily introduced into the semiconductor layer; a partial isolating region in which a field insulating film thicker than the gate insulating film intervenes between the semiconductor layer and an extending portion of the gate electrode, and an impurity with the same conductivity type as the body contact region is introduced into the semiconductor layer; and a full isolating region in which the semiconductor layer on the insulator is removed. The full isolating region is formed to be in contact with at least a part of a side parallel to the first direction of the source/drain regions of the field effect transistor.

The gate electrode includes a first gate electrode layer having substantially the same thickness as the field insulating film and a second gate electrode layer formed on the first gate electrode layer and extending over a carrier path.

The first gate electrode layer and the second gate electrode layer can be made of a material deposited in different processes. The first gate electrode layer and the second gate electrode layer can be made of different materials.

An impurity density in the semiconductor layer in a part of the partial isolating region contiguous to a device region in which the field effect transistor is provided can be lower than an impurity density in the semiconductor layer in the other part of the partial isolating region.

An impurity density in the semiconductor layer in a part of the partial isolating region contiguous to a device region in which the field effect transistor is provided can be lower than an impurity density in the semiconductor layer in the other part of the partial isolating region and can be the same as an impurity density in the semiconductor layer in the device region.

The full isolating region can be formed to be in contact with the whole sides parallel to the first direction of the source/drain regions of the field effect transistor. The full isolating region can be formed to be in contact with the whole sides parallel to the first direction of the source/drain regions of the field effect transistor and a part of a side perpendicular to the first direction of the source/drain regions. The full isolating region can be formed to be in contact with a part of a side parallel to the first direction of the source/drain regions of the field effect transistor and the whole of one side perpendicular to the first direction of the source/drain regions.

Only the full isolating region can be provided between the adjacent field effect transistors. A plurality of the field effect transistors can be provided in one block surrounded by the full isolating region.

The p-channel field effect transistor and the n-channel type field effect transistor can be provided in different blocks surrounded by the full isolating region, respectively. A plurality of the p-channel type field effect transistors and a plurality of the n-channel type field effect transistors can be provided in different blocks surrounded by the full isolating region, respectively.

The full isolating region defining a block including a plurality of the field effect transistors can be formed to be in contact with a side of the source/drain regions. The full isolating region defining a block including one field effect transistor can be formed to be in contact with a side of the source/drain regions.

In another aspect of the present invention, a method for manufacturing a semiconductor device includes: (a) forming a CMP (Chemical Mechanical Polishing) mask to cover a device region and a body contact region on a semiconductor layer on an insulator, the CMP mask being composed of an upper mask layer resistant to a CMP and a lower mask layer made of a conductive material or a material which can be made conductive by introducing impurity; (b) introducing a second conductivity type impurity into at least a portion of the semiconductor layer which is not covered by the CMP mask, the second conductivity type impurity is different from an impurity which is to be introduced into source/drain regions; (c) forming a full isolating region by removing the semiconductor layer on the insulator in a part of a region contiguous to the CMP mask; (d) forming wholly a second insulating film different from a material of the CMP mask and planarizing the second insulating film by a CMP; (e) removing the upper mask layer of the CMP mask and forming an upper gate electrode layer made of a conductive material or a material which can be made conductive by introducing impurity; (f) removing the upper gate electrode layer and the lower mask layer of the CMP mask in the body contact region and a part of the device region, to form a gate electrode composed of a residual of the upper gate electrode layer and the lower mask layer of the CMP mask and extending in a first direction; and (g) forming source/drain regions in the semiconductor layer on both sides of the gate electrode to form a field effect transistor. The full isolating region is formed to be in contact with at least a part of a side parallel to the first direction of the source/drain regions of the field effect transistor.

The (d) forming step can be carried out after the (c) forming step. The (c) forming step can be carried out after the (d) forming step.

A method for manufacturing a semiconductor device may include (h) forming a CMP (Chemical Mechanical Polishing) mask to cover a device region and a body contact region on a semiconductor layer on an insulator, the CMP mask being composed of an upper mask layer resistant to a CMP and a lower mask layer made of a conductive material or a material which can be made conductive by introducing impurity; (i) introducing a second conductivity type impurity into at least a portion of the semiconductor layer which is not covered by the CMP mask, the second conductivity type impurity is different from an impurity which is to be introduced into source/drain regions; (j) forming wholly a second insulating film different from a material of the CMP mask and planarizing the second insulating film by a CMP; (k) removing the upper mask layer of the CMP mask and forming an upper gate electrode layer made of a conductive material or a material which can be made conductive by introducing impurity; (l) removing the upper gate electrode layer and the lower mask layer of the CMP mask in the body contact region and a part of the device region, to form a gate electrode composed of a residual of the upper gate electrode layer and the lower mask layer of the CMP mask and extending in a first direction; (m) forming source/drain regions in the semiconductor layer on both sides of the gate electrode to form a field effect transistor; (n) covering the field effect transistor by an interlayer insulating film and planarizing the interlayer insulating film; and (o) forming a full isolating region by removing the semiconductor layer in a part of a region contiguous to the source/drain regions. The full isolating region is formed to be in contact with at least a part of a side parallel to the first direction of the source/drain regions of the field effect transistor.

The CMP mask can be a multiple-layer including a $Si_3N_4$ film as a top layer. The CMP mask can be a multiple-layer including a $SiO_2$ film as a top layer and a $Si_3N_4$ film as a second layer under the top layer. The CMP mask is a multiple-layer including a $Si_3N_4$ film as a top layer and a polysilicon film as a second layer under the top layer. The CMP mask is a multiple-layer including a $Si_3N_4$ film as a top layer, a $SiO_2$ film as a second layer under the top layer, and a polysilicon film as a third layer under the second layer.

The (b) introducing step can be carried out such that the second conductivity type impurity is the same as an impurity which is to be introduced into the semiconductor layer in the body contact region.

Materials of the lower mask layer of the CMP mask and the upper gate electrode layer can be polysilicon. The upper gate electrode layer can be a multiple-layer made of a conductive material or a material which can be made conductive by introducing impurity. The lower mask layer of the CMP mask can be made of polysilicon and the upper gate electrode layer can be made of metal.

A side wall can be formed next to the CMP mask after the (a) forming step. The (b) introducing step is carried out such that the second conductivity type impurity is introduced into at least a portion of the semiconductor layer which is not covered by the CMP mask and the side wall.

DESCRIPTION OF THE PREFERRED EMBODIMENT

The present invention relates to U.S. patent application Ser. No. 10/163,984, filed on Jun. 6, 2002. The disclosure of the application is incorporated herein by reference.

Embodiments of the present invention will be described below with reference to the attached drawings.

[First Embodiment]

Figure 6:
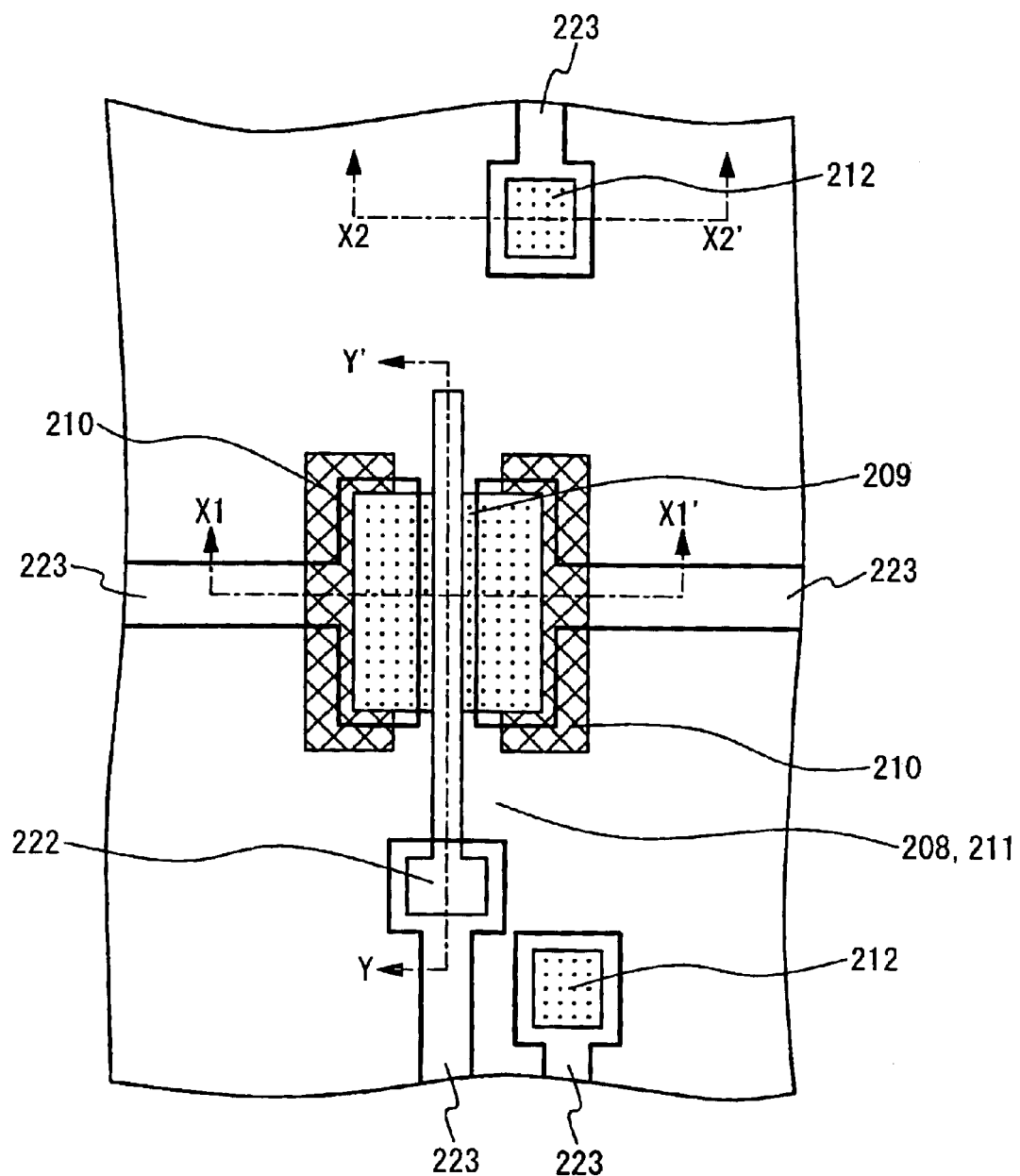
FIG. 6 is a plan view showing a structure of an SOI transistor according to a first embodiment of the present invention.
Figure 7A:
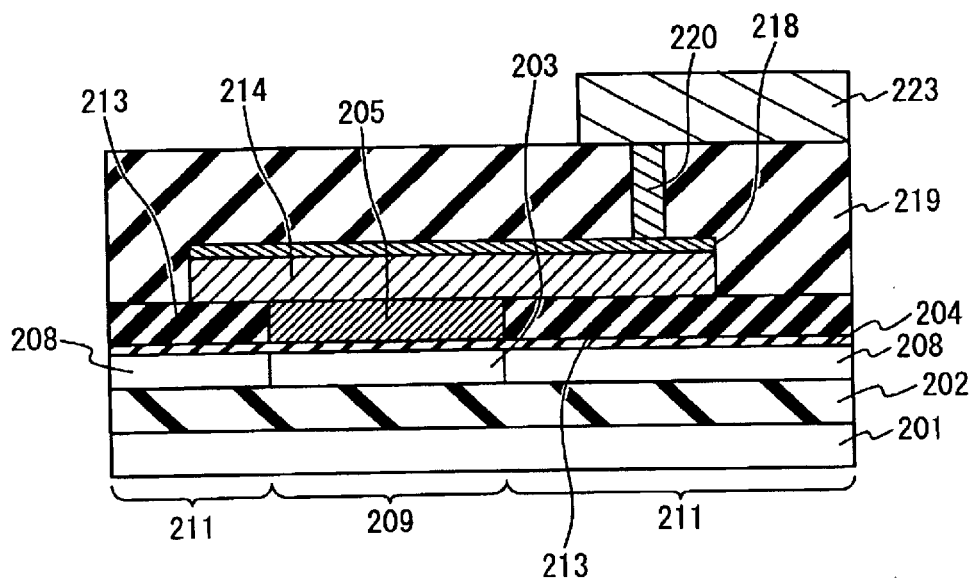
FIG. 7A is a cross sectional view along a dashed line Y–Y' in FIG. 6.
Figure 7B:
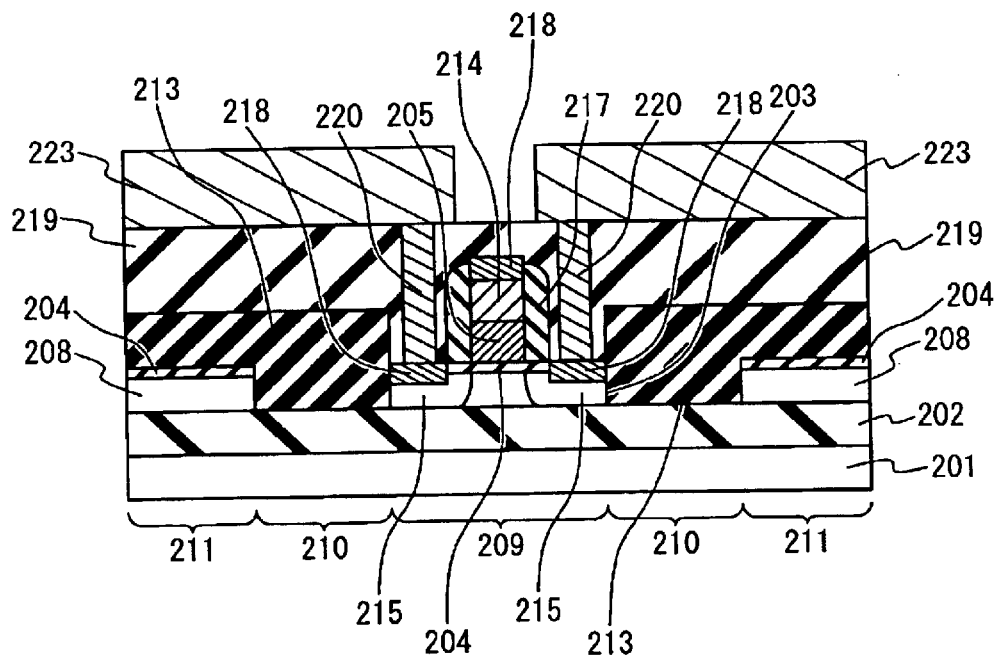
FIG. 7B is a cross sectional view along a dashed line X1–X1' in FIG. 6.
Figure 7C:
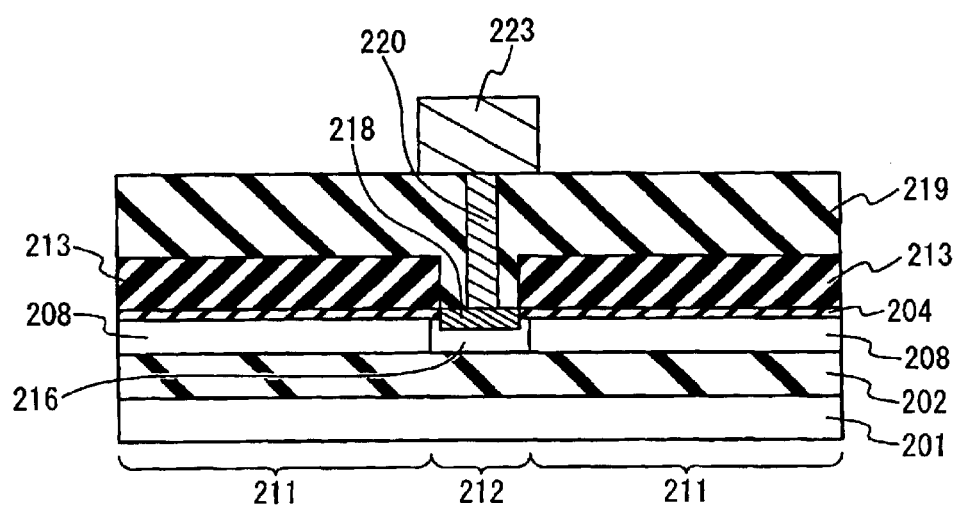
FIG. 7C is a cross sectional view along a dashed line X2–X2' in FIG. 6.

FIG. 6 is a plan view showing a structure of a semiconductor device according to a first embodiment of the present invention. FIGS. 7A, 7B and 7C are cross sectional views along dashed lines Y–Y', X1–X1' and X2–X2' in FIG. 6, respectively.

An SOI substrate is composed of a silicon substrate 201, a buried insulating film 202 on the silicon substrate 201, and an SOI layer 203 on the buried insulating film 202 (see FIGS. 7A to 7C). A gate insulating film 204 is formed on the SOI layer 203. As shown in FIG. 6, a transistor active region 209 (a device region) is formed in a predetermined area of the SOI substrate. A body contact region 212 is formed in the SOI substrate apart from the transistor active region 209. Impurity is introduced to the SOI layer 203 of a region other than the transistor active region 209 and the body contact region 212 to form a carrier path 208 (an area other than a hatched area in FIG. 6). The carrier path 208 electrically connects the transistor active region 209 and the body contact region 212.

As shown in FIG. 7B, source/drain regions 215 are formed in the SOI layer 203 of the transistor active region 209.

As shown in FIG. 7C, a heavily doped layer 216 is formed in the SOI layer 203 of the body contact region 212. A silicide layer 218 is formed on the heavily doped layer 216 and is connected to a wiring 223 (indicated by a thick line in FIG. 6) through a contact 220 penetrating an interlayer insulating film 219. Excess carriers in the transistor active region 209 can escape out of the SOI transistor through the carrier path 208 and the body contact region 212. Thus, the floating body effects can be suppressed.

Figure 4:
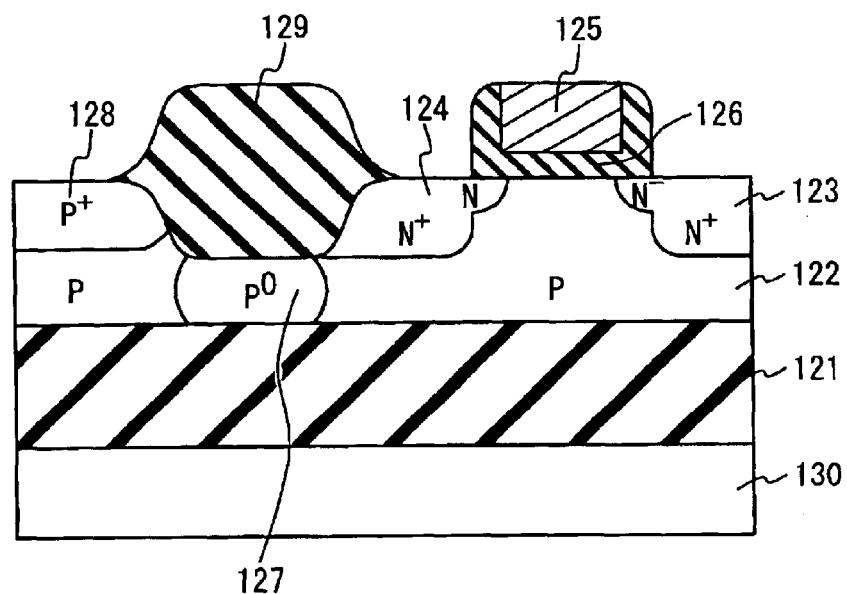
FIG. 4 is a cross sectional view showing a structure of another conventional SOI transistor.
Figure 5:
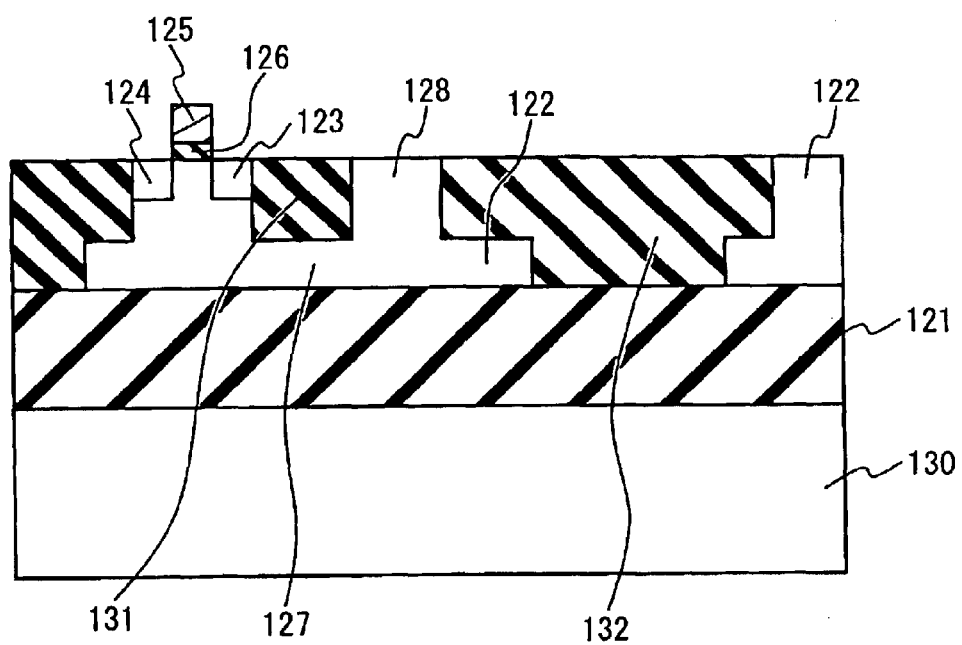
FIG. 5 is a cross sectional view showing a structure of still another conventional SOI transistor.

A field insulating film 213 is formed on the SOI substrate. In a full isolating region 210 (indicated by a heavily hatched area in FIG. 6), the field insulating film 213 reaches the buried insulating film 202 as shown in FIG. 7B. In a partial isolating region 211, the field insulating film 213 is formed over the carrier path 208 as shown in FIGS. 7A to 7C. In the SOI transistor according to the present embodiment, device isolation is achieved without using a LOCOS (Local Oxidation of Silicon) region as in FIG. 4 or an STI (Shallow Trench Isolation) as in FIG. 5. Instead, the field insulating film 213 is "elevated" over the SOI layer 203 (the carrier path 208). Hence, thickness of the carrier path 208 in the partial isolating region 211 is substantially the same as that of the SOI layer 203 in the transistor active region 209 and the body contact region 212. Therefore, even when the SOI layer is extremely thin (e.g. 5 to 50 nm) as in a full-depletion SOI MOSFET (Metal Oxide Semiconductor Field Effect Transistor), the carrier path is effective in avoiding the floating body effects.

As shown in FIG. 7B, the silicide layers 218 are formed on the source/drain regions 215. Each of the silicide layers 218 is connected to a wiring 223 (indicated by a thick line in FIG. 6) through a contact 220 penetrating the interlayer insulating film 219. A gate electrode is formed on the gate insulating film 204. The gate electrode includes a lower gate electrode layer 205 and an upper gate electrode layer 214. The lower gate electrode layer 205 is between the field insulating film 213 of the partial isolating region 211 as shown in FIG. 7A. The upper gate electrode layer 214 is formed on the lower gate electrode layer 205 and extends over the field insulating film 213. The direction in which the upper gate electrode layer 214 extends is referred to as a first direction, hereinafter. A silicide layer 218 formed on the upper gate electrode layer 214 is connected to a wiring 223 through a contact 220 penetrating the interlayer insulating film 219. The gate electrode is surrounded by a gate side wall 217 made of an insulating film.

The high impurity density in the carrier path 208 generally causes increase in leak current and parasitic capacitance between the transistor active region 209 and the carrier path 208. In the present invention, however, the full isolating region 210 indicated by the heavily hatched area in FIG. 6 is provided in contact with a side of the source/drain regions 215 (transistor active region 209). According to the present embodiment, the full isolating region 210 is provided in contact with two sides of the source/drain regions 215 along the dashed line Y–Y' (first direction). The full isolating region 210 can be formed to be in contact with at least one of a first side of the source region 215 parallel to the first direction and a second side of the drain region 215 parallel to the first direction. Other two sides of the transistor active region 209 (along the dashed line X1–X1') are partly in contact with the full isolating region 210. A part of the transistor active region 209 is connected to the carrier path 208 as shown in FIG. 7A. Thus, the leak current and the parasitic capacitance between the transistor active region 209 and the carrier path 208 are reduced with suppressing the floating body effects.

A method for manufacturing the semiconductor device shown in FIG. 6 and FIGS. 7A to 7C will be described below in detail.

Figure 8:
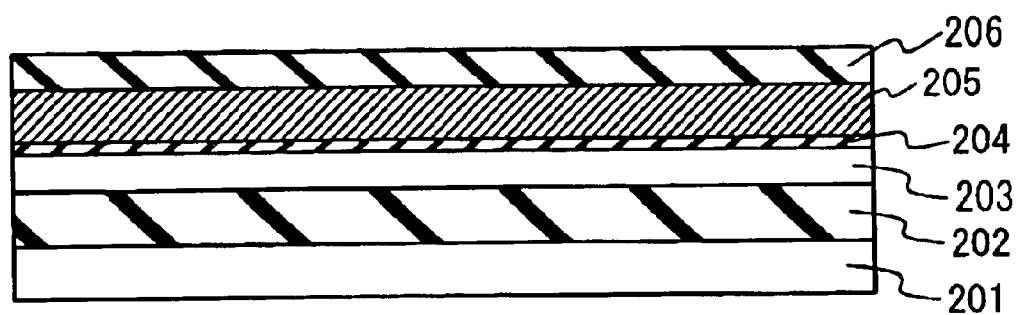
FIG. 8 is a cross sectional view showing a structure of the SOI transistor at a manufacturing process according to the first embodiment of the present invention.

As shown in FIG. 8, an SOI substrate is provided, which includes the silicon substrate 201, the buried insulating film 202 formed on the silicon substrate 201, and the SOI layer 203 formed on the buried insulating film 202. Here, the buried insulating film 202 is made of $SiO_2$, whose thickness is 100 nm for example. Thickness of the SOI layer 203 is typically 5 to 50 nm. The gate insulating film 204 of 1.5 nm in thick is formed on the SOI layer 203 through a thermal oxidation process. A first polysilicon layer 205 (corresponding to the lower gate electrode layer 205) of 50 nm in thick and a $Si_3N_4$ film 206 of 150 nm in thick are formed in this order through a thin film deposition method such as a CVD (Chemical Vapor Deposition).

Figure 9:
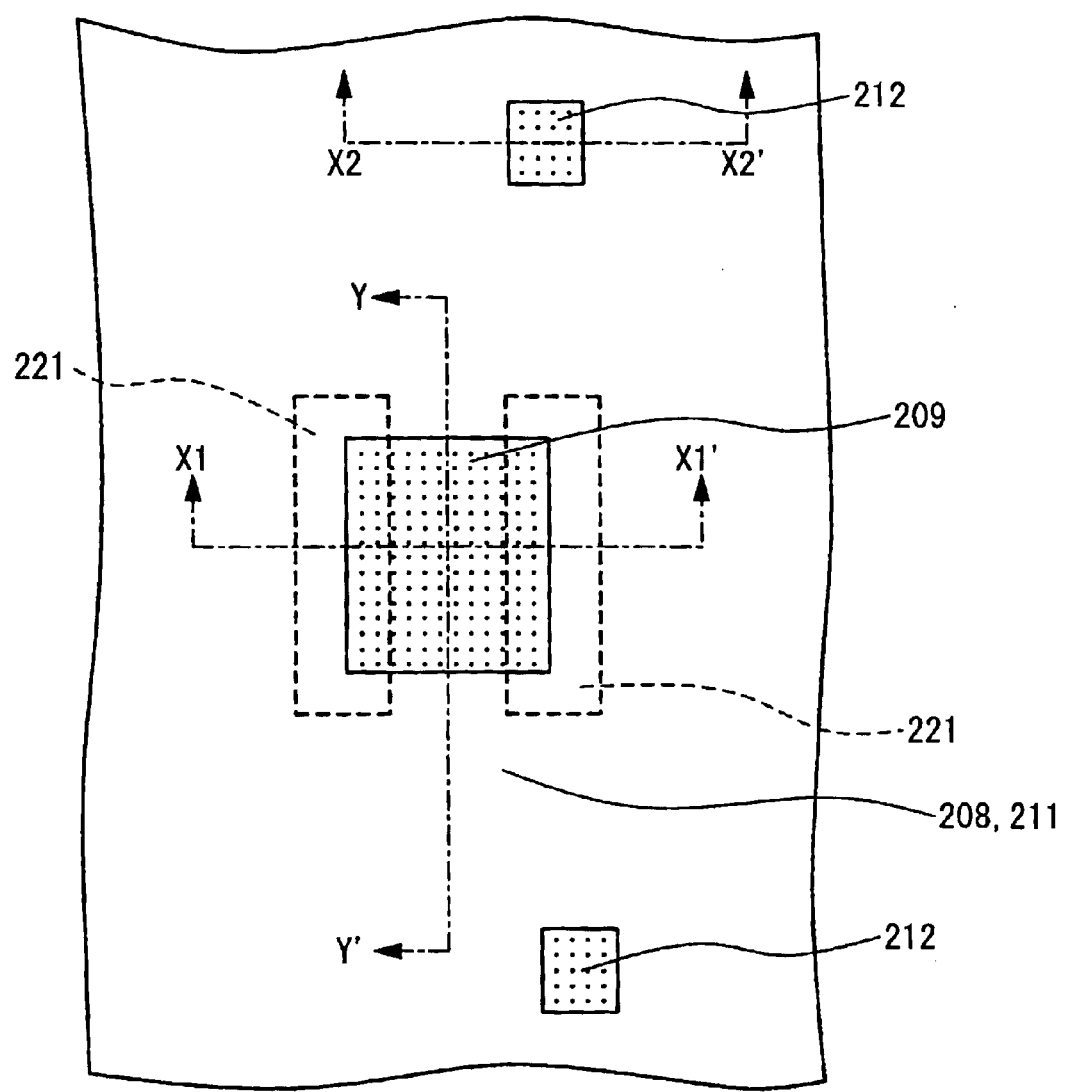
FIG. 9 is a plan view showing a structure of the SOI transistor at another manufacturing process.
Figure 10A:
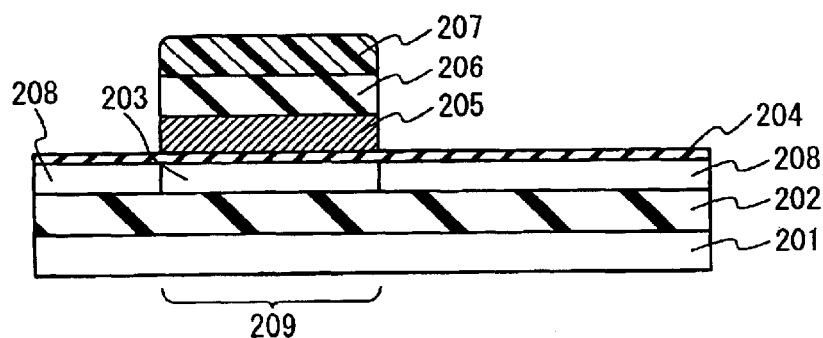
FIG. 10A is a cross sectional view along a dashed line Y–Y' in FIG. 9.
Figure 10B:
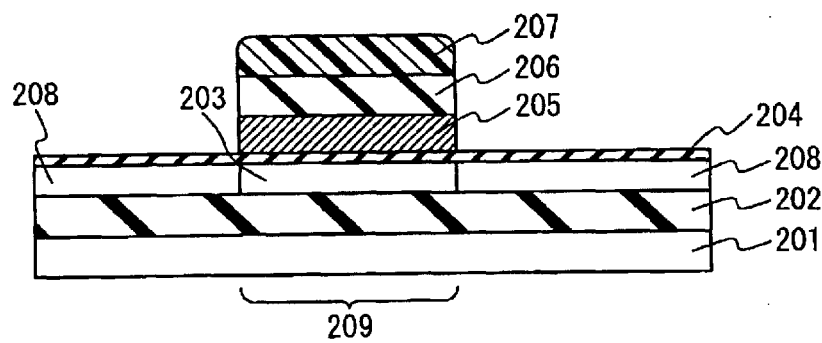
FIG. 10B is a cross sectional view along a dashed line X1–X1' in FIG. 9.
Figure 10C:
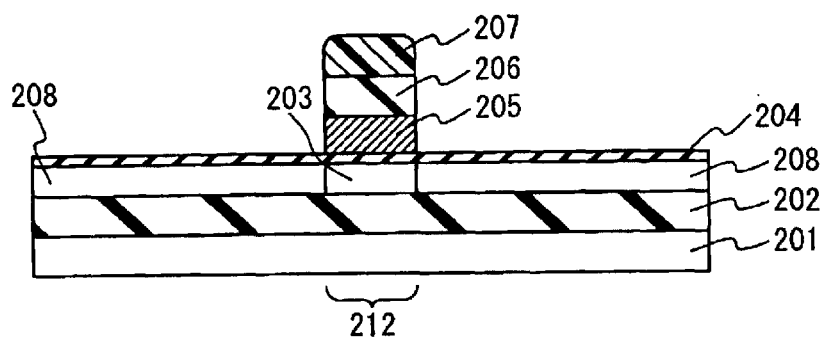
FIG. 10C is a cross sectional view along a dashed line X2–X2' in FIG. 9.

A resist 207 is formed to cover predetermined regions where the transistor active region 209 and the body contact region 212 are to be formed (see FIG. 9). After that, the $Si_3N_4$ film 206 and the first polysilicon layer 205 are etched through an RIE (Reactive Ion Etching) by using the resist 207 as a mask. Then, impurity is introduced into the SOI layer 203 through an ion implantation process by using the resist 207 or the $Si_3N_4$ film 206 as a mask, to form the carrier path 208. The region of the carrier path 208 is indicated by a white area other than a hatched area in FIG. 9. FIGS. 10A to 10C are cross sectional views along dashed lines Y–Y', X1–X1' and X2–X2' in FIG. 9, respectively.

The conductivity type of the implanted impurity ion is a p-type around a region where an n-channel transistor is to be formed (hereinafter, referred to as an n-channel transistor region), and n-type around a region where a p-channel transistor is to be formed (hereinafter, referred to as a p-channel transistor region). As the p-type impurity ion, for example, $B^+$, $BF^{2+}$ and In can be used. As the n-type impurity ion, for example, $As^+$, $P^+$ and $Sb^+$ can be used. A method of introducing different impurities into the SOI layer 203 around the p-channel transistor region and the n-channel transistor region is as follows. The resist 207 is first removed. In the case of introducing the impurity around the n-channel transistor region, a new photo resist is formed over and around the p-channel transistor region. The ion implantation is carried out by using the new photo resist and the $Si_3N_4$ film 206 exposed at the n-channel transistor region as a mask. Similar processes are carried out in the case of the p-channel transistor region. The impurity density in the carrier path 208 is typically in a range from $1\times10^{18}$ cm$^{-3}$ to $1\times10^{20}$ cm$^{-3}$. The amount of dose is typically in a range from $1\times10^{-}$cm$^{-2}$ to $1\times10^{15}$ cm$^{-2}$.

As described above, the impurity is introduced into the SOI layer 203 to form the carrier path 208 after covering by the mask the region where the transistor active region 209 is to be formed. Thus, the edge of the carrier path 208 can be formed to self-align with the edge of the transistor active region 209. Moreover, the carrier path 208 and the transistor active region 209 are formed to be exclusive to each other. The impurity density in the carrier path 208 and that in the transistor active region 209 can be controlled independently. Therefore, the impurity density in the carrier path 208 can be made higher than that in the channel region in order to reduce resistivity of the carrier path 208.

It should be noted that the impurity should be introduced at least along a path connecting the transistor active region 209 and the body contact region 212 (see FIG. 6). It is possible that the impurity is not introduced in a region other than the path.

Figure 11:
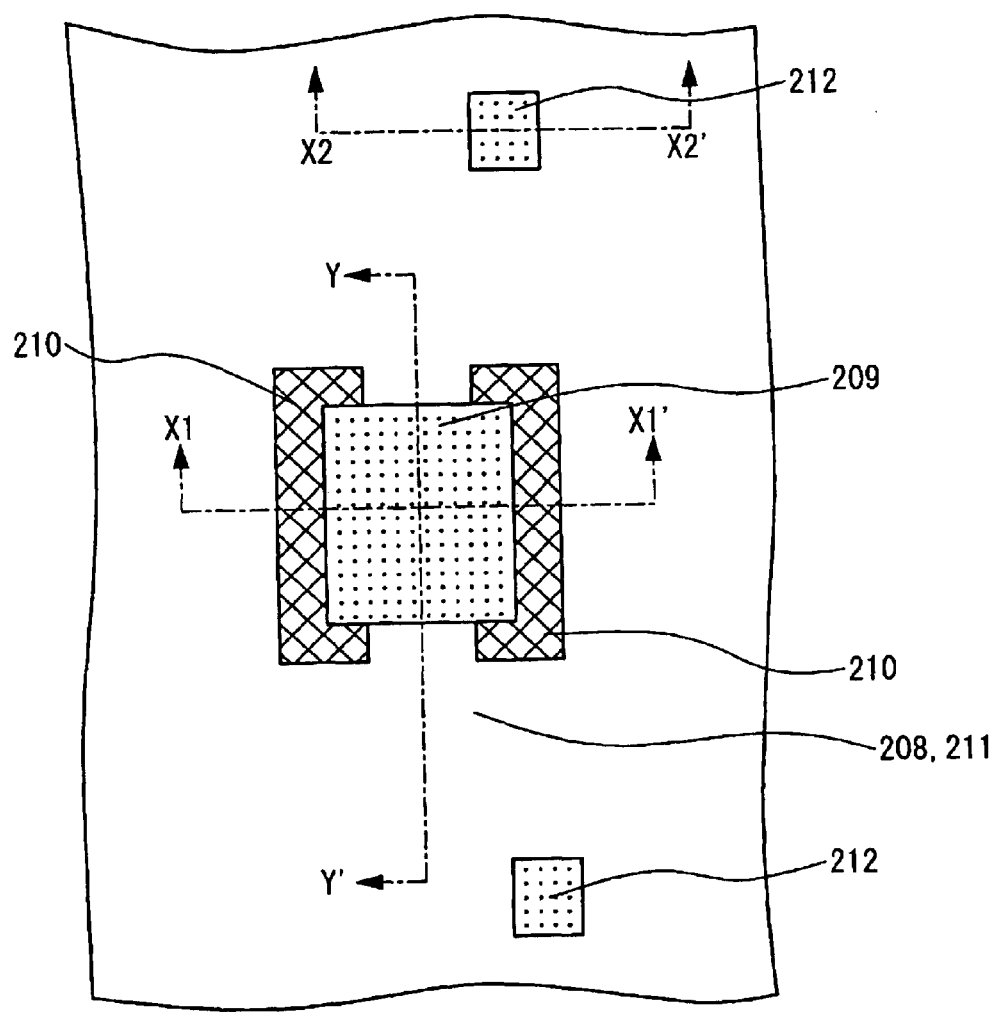
FIG. 11 is a plan view showing a structure of the SOI transistor at still another manufacturing process.
Figure 12A:
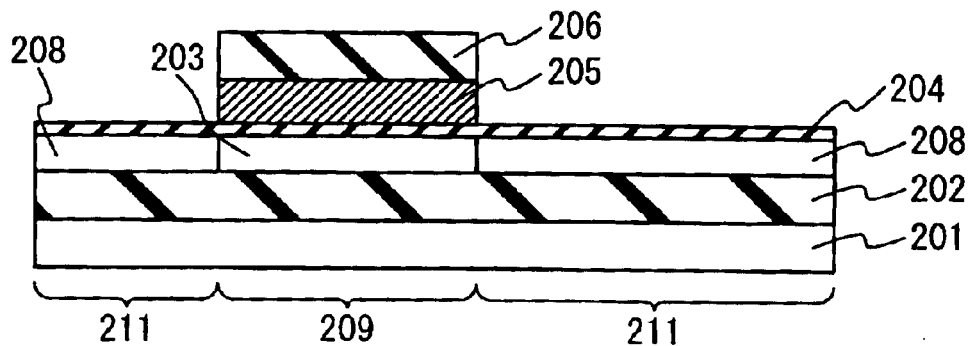
FIG. 12A is a cross sectional view along a dashed line Y–Y' in FIG. 11.
Figure 12B:
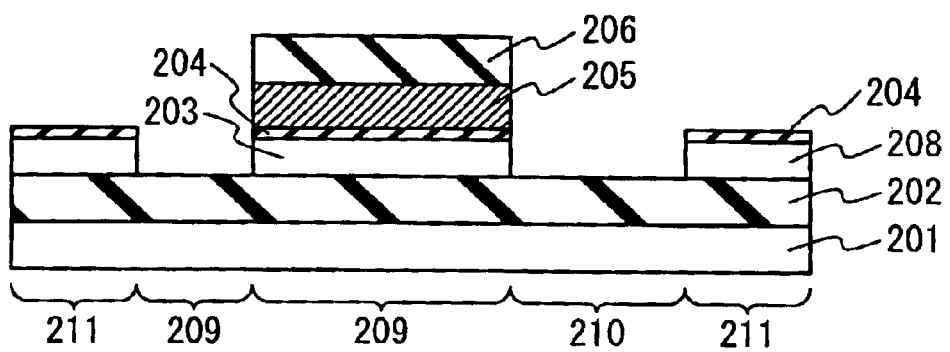
FIG. 12B is a cross sectional view along a dashed line X1–X1' in FIG. 11.
Figure 12C:
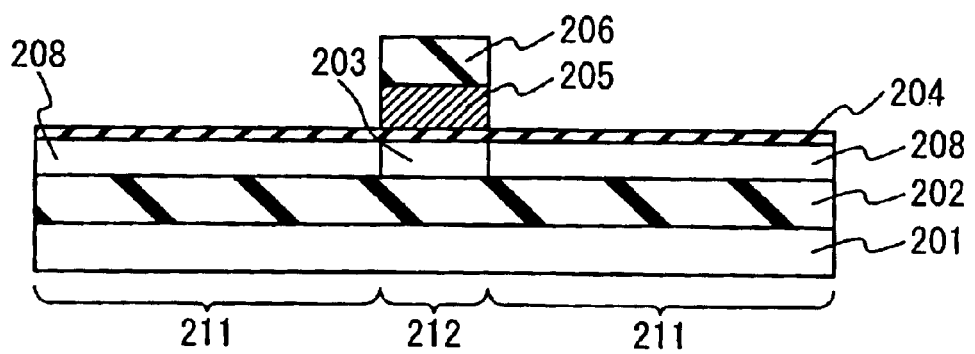
FIG. 12C is a cross sectional view along a dashed line X2–X2' in FIG. 11.

Next, an opening area 221 indicated by a dashed rectangular in FIG. 9 is provided in the mask (resist 207 and the new photo resist mentioned above). After that, in a part of the region next to the transistor active region 209, the gate insulating film 204 and the SOI layer 203 (carrier path 208) are removed by using the resist pattern and the $Si_3N_4$ film 206 as a mask. Then, the resist pattern is removed. FIG. 11 is a plan view showing a structure of the semiconductor device at this time. FIGS. 12A to 12C are cross sectional views along dashed lines Y–Y', X1–X1' and X2–X2' in FIG. 11, respectively. Here, the buried insulating film 202 is exposed in the full isolating region 210 indicated by a heavily hatched area in FIG. 11.

Figure 13A:
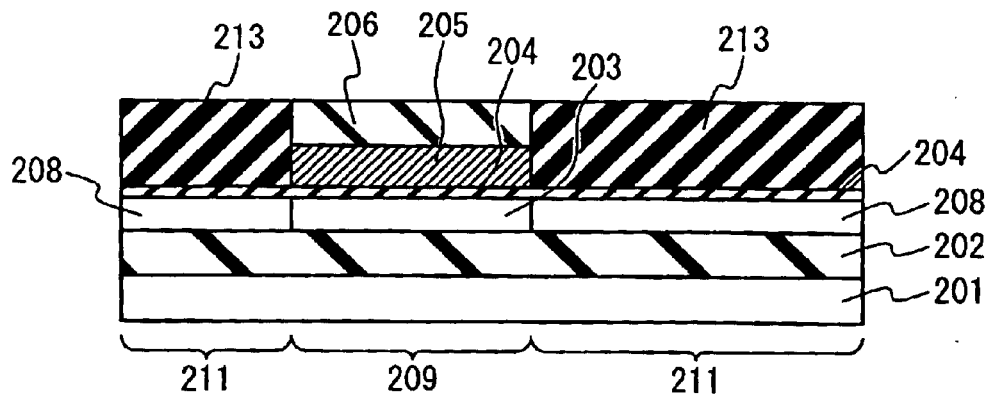
FIGS. 13A to 13C are cross sectional views showing structures of the SOI transistor at still another manufacturing process.
Figure 13B:
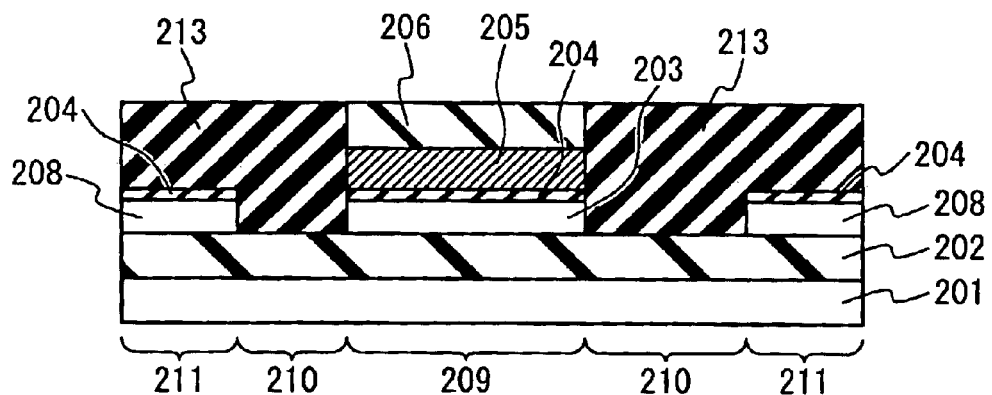
Figure 13C:
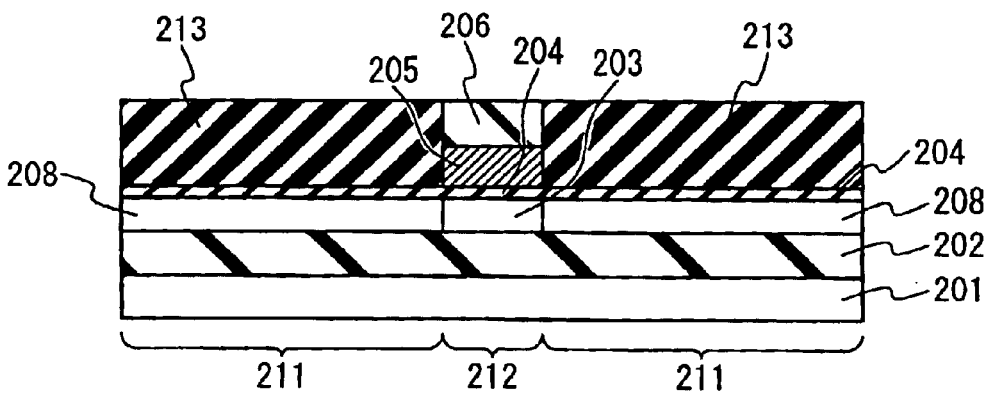

Next, the whole area is covered by the field insulating film 213 ($SiO_2$ film) through a CVD process. Then, the field insulating film 213 is planarized by a CMP (Chemical Mechanical Polishing). Here, the $Si_3N_4$ film 206 acts as a stopper layer. FIGS. 13A to 13C are cross sectional views at this time along dashed lines Y–Y', X1–X1' and X2–X2', respectively. The field insulating film 213 in the full isolating region 210 is in contact with the buried insulating film 202 and a side of the transistor active region 209, and extends over the carrier path 208 to form the partial isolating region 211.

As described above, in the SOI transistor according to the present embodiment, device isolation is achieved without using a LOCOS region or an STI. Instead, the field insulating film 213 is "elevated" over the carrier path 208. Hence, thickness of the carrier path 208 in the partial isolating region 211 is substantially the same as that of the SOI layer 203 in the transistor active region 209 and the body contact region 212 as shown in FIGS. 13A to 13C. Therefore, the carrier path 208 is effective in avoiding the floating body effects even in the case of a very thin SOI layer 203. Moreover, the full isolating region 210 is provided in contact with a side of the transistor active region 209 (see FIG. 11). Thus, the leak current and the parasitic capacitance are kept low between the transistor active region 209 and the carrier path 208. Also, the edge of the field insulating film 213 reflects the vertical edge of the transistor active region 209 formed by RIE (see FIGS. 10A to 10C). Thus, the edge of the field insulating film 213 is formed to be steep and self-align with the edge of the active region 209. Also, the field insulating film 213 is formed and processed while the transistor active region 209 is covered by the mask. Therefore, the SOI layer 203 in the transistor active region 209 is not damaged during the device isolation process.

Figure 14A:
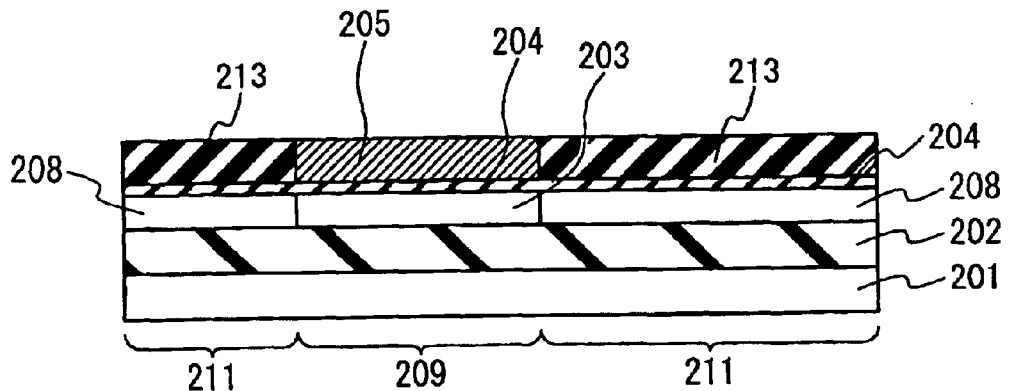
FIGS. 14A to 14C are cross sectional views showing structures of the SOI transistor at still another manufacturing process.
Figure 14B:
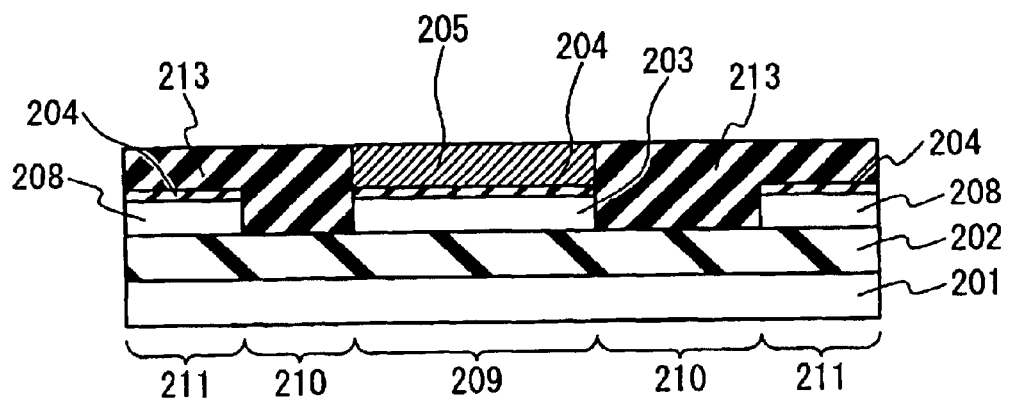
Figure 14C:
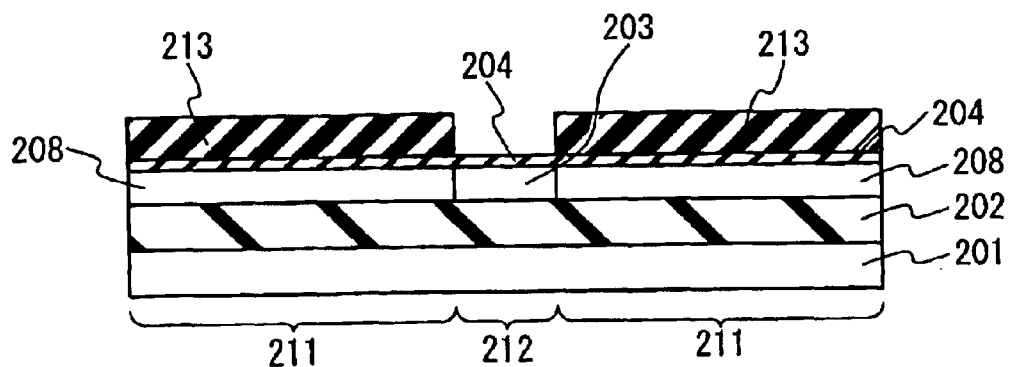

Next, the $Si_3N_4$ film 206 is removed by a wet etching using heated phosphoric acid or a dry etching such as an RIE. Here, it is preferable to carry out the etching under a condition that the $Si_3N_4$ film 206 and the field insulating film 213 are etched at a same etching rate, so that the top of the first polysilicon layer 205 and the top of the field insulating film 213 align with each other. In the body contact region 212, the first polysilicon layer 205 is also removed. FIGS. 14A to 14C are cross sectional views at this time along dashed lines Y–Y', X1–X1' and X2–X2', respectively.

Figure 15:
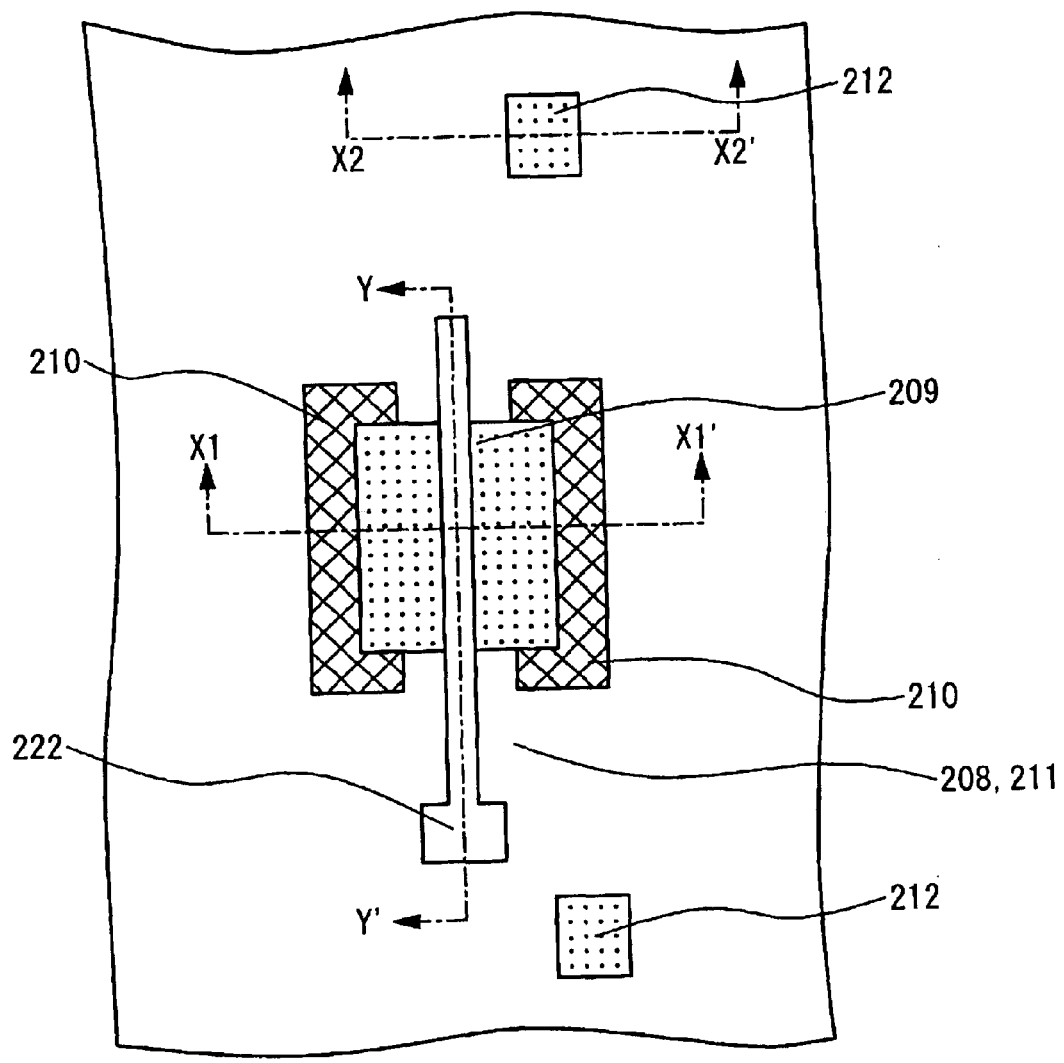
FIG. 15 is a plan view showing a structure of the SOI transistor at still another manufacturing process.
Figure 16A:
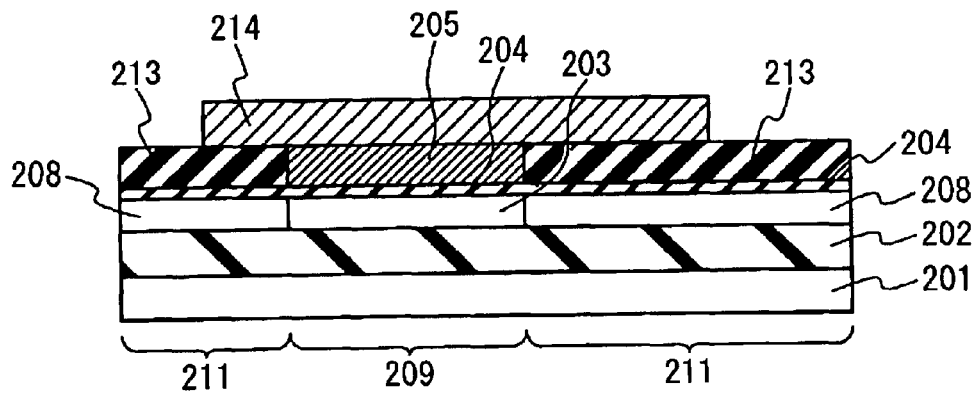
FIG. 16A is a cross sectional view along a dashed line Y–Y' in FIG. 15.
Figure 16B:
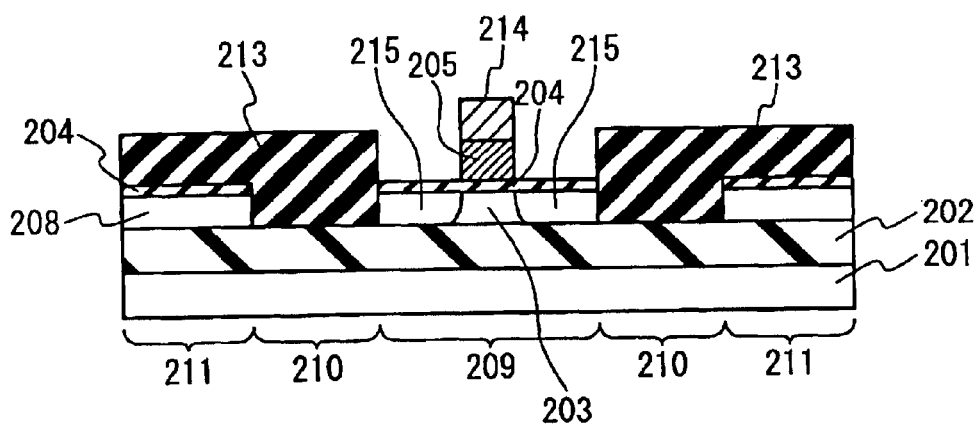
FIG. 16B is a cross sectional view along a dashed line X1–X1' in FIG. 15.
Figure 16C:
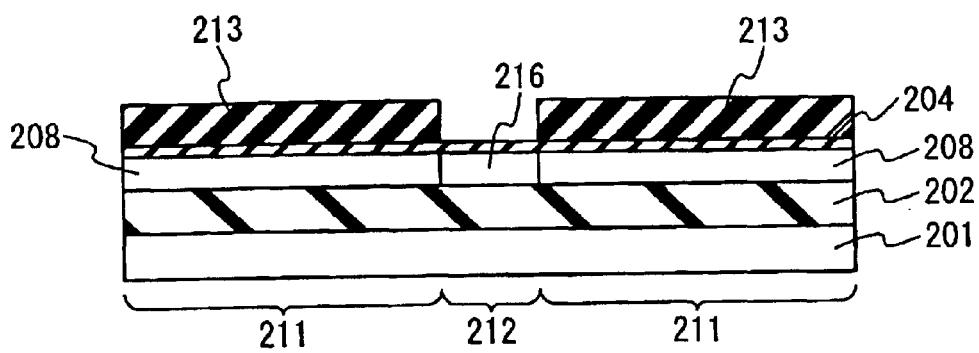
FIG. 16C is a cross sectional view along a dashed line X2–X2' in FIG. 15.

The following steps will be described with reference to FIGS. 15 and 16A to 16C. FIG. 15 is a plan view showing a structure of the semiconductor device. FIGS. 16A to 16C are cross sectional views along dashed lines Y–Y', X1–X1' and X2–X2' in FIG. 15, respectively.

A second polysilicon layer 214 (corresponding to the upper gate electrode layer 214) is formed over the first polysilicon layer 205. Then, the first and second polysilicon layers in a predetermined area are removed by an etching process such as an RIE by using a resist as a mask. A gate electrode 222 is obtained, which is composed of the lower gate electrode layer 205 and the upper gate electrode layer 214. Here, the upper gate electrode layer 214 is designed to cover at least a part of the region where the transistor active region 209 is connected to the partial isolating region 211 (see FIGS. 15 and 16A).

Figure 2A:
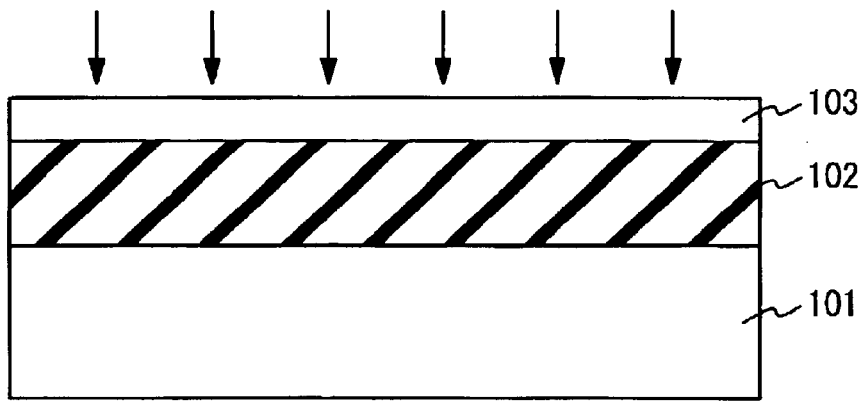
FIGS. 2A to 2C show a method of forming an isolation insulating film in the conventional SOI transistor shown in FIGS. 1A and 1B.
Figure 2B:
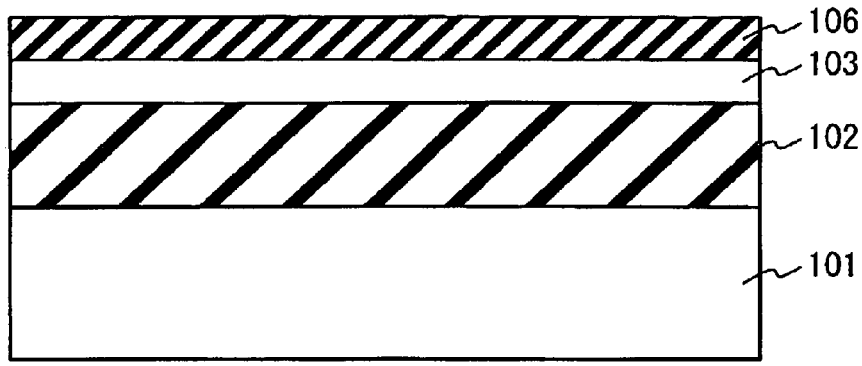
Figure 2C:
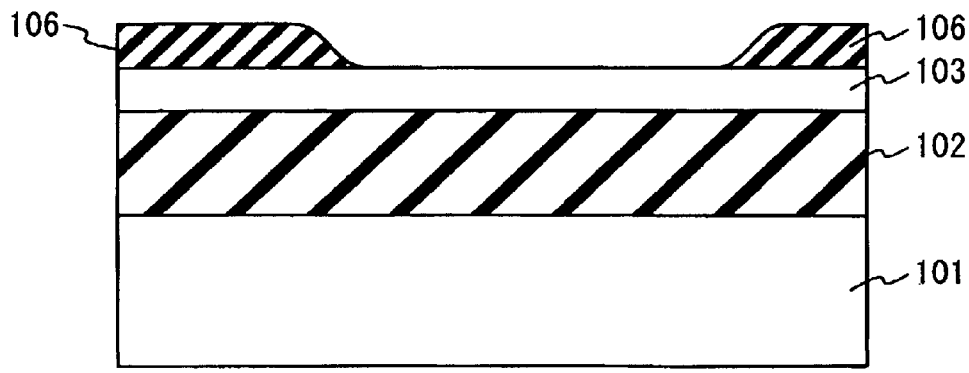
Figure 3A:
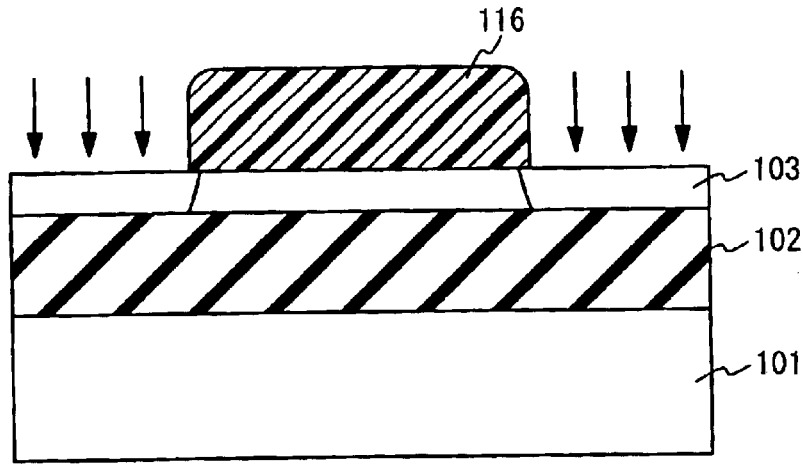
FIGS. 3A to 3C show another method of forming the isolation insulating film in the conventional SOI transistor shown in FIGS. 1A and 1B.
Figure 3B:
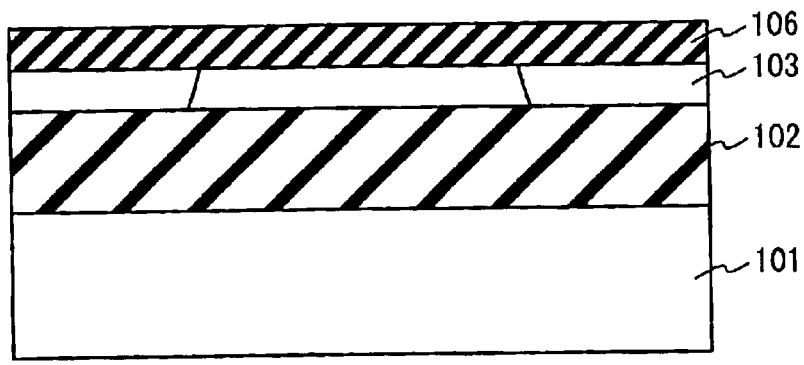
Figure 3C:
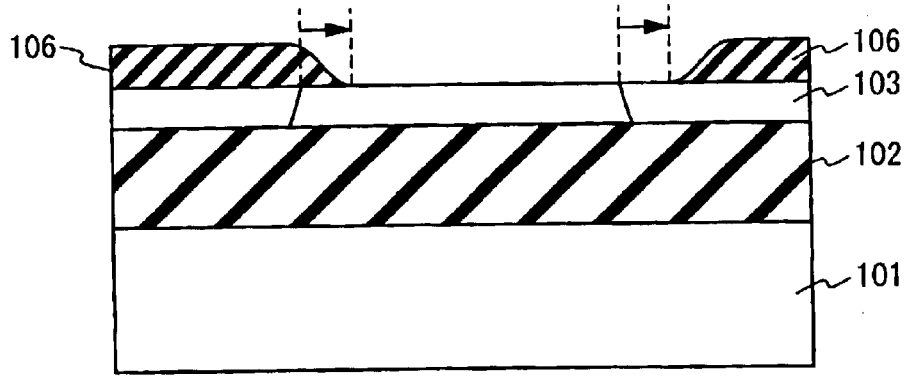

As described above, the second polysilicon layer 214 is formed after the first polysilicon layer 205 is planarized. Therefore, material for the gate electrode (the first polysilicon layer 205, the second polysilicon layer 214 or a dummy gate electrode layer) has a planar surface. Also, since the edge of the field insulating film 213 is formed to be substantially vertical unlike in the case shown in FIGS. 2C and 3C, the bottom surface of the material is also planar. Therefore, the gate electrode 222 can be formed without any difficulty, because the top and bottom surfaces of the material are planar and an over etching is not caused in forming the gate electrode 222 through the lithography and the RIE.

Next, impurity is heavily introduced into the SOI layer 203 of the transistor active region 209 through an ion implantation process by using the gate electrode 222 and the field insulating film 213 as a mask, to form the source/drain regions 215 (see FIG. 16B). Also, impurity with a different conductivity type from that of the source/drain regions 215 is heavily introduced into the SOI layer 203 in the body contact region 212 through an ion implantation process, to form the heavily doped layer 216 (see FIG. 16C). Next, the gate side wall 217, the silicide layers 218, the interlayer insulating layer 219, the contacts 220 and the wiring 223 are formed according to normal processes. In this way, the semiconductor device shown in FIGS. 6 and 7A to 7C is obtained.

Figure 17A:
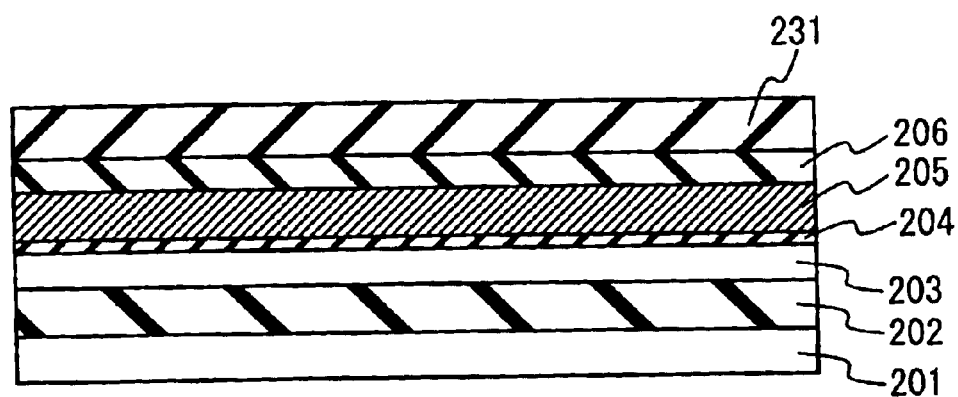
FIGS. 17A and 17B show another method for manufacturing the SOI transistor according to the first embodiment of the present invention.
Figure 17B:
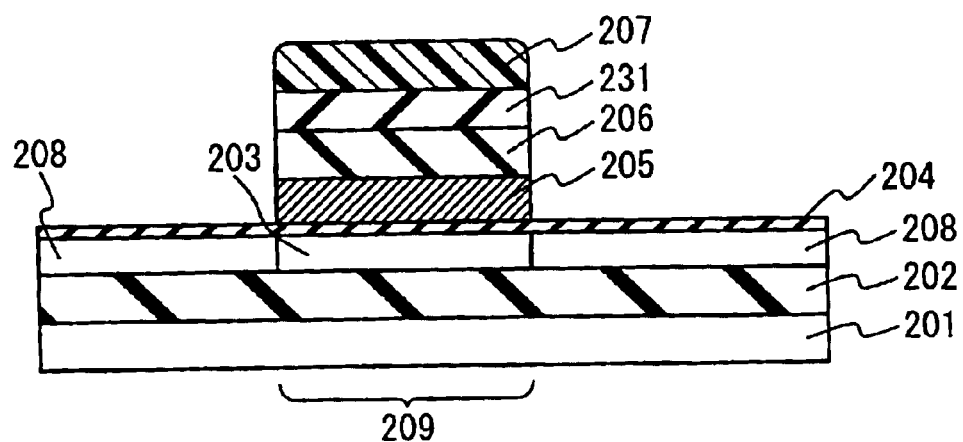

In the manufacturing method mentioned above, a $SiO_2$ film 231 can be formed successively after forming the $Si_3N_4$ film 206 which is the top layer of a CMP mask in FIG. 8. In this case, the structures shown in FIGS. 8 and 10B are changed to structures shown in FIGS. 17A and 17B, respectively, and the top layer of the CMP mask is the $SiO_2$ film 231. The $SiO_2$ film 231 is effective to prevent the $Si_3N_4$ film 206 from being etched due to difference in the etching selection rate at the time of the etching for forming the full isolating region 210 through the opening area 221 indicated by the dashed rectangular in FIG. 9. The $SiO_2$ film 231 is removed together at the time when planarizing the field insulating film 213 by the CMP (see FIGS. 14A to 14C).

The material of the upper gate electrode layer 214 and the material of the lower gate electrode layer 205 may be the same and different. For example, both the upper and lower gate electrode layers can be made of the same material such as polysilicon, silicon germanium, metal silicide, metal and so on. The upper and lower gate electrode layers can be made of respective different conductive materials such as polysilicon, silicon germanium, metallic silicide, metal and so on. In a typical example, the lower gate electrode layer is made of polysilicon or polysilicon-germanium which has a high selective etching ratio to the gate insulating film and has a great processability. The upper gate electrode layer is made of metal or metallic silicide such as tungsten silicide, TiN, cobalt silicide which have low resistivity. This combination has an advantage of the great processability and the low resistivity. Also, the lower gate electrode layer can be made of semiconductor, semiconductor silicide, metallic nitride, metallic compound, metal and so on such as TiN, MoN, WN, platinum silicide, erbium silicide, silicon germanium mixed crystal, germanium and the like for the purpose of controlling gate work function. The upper gate electrode layer can be made of material with low resistivity such as metallic silicide and metal different from the material of the lower gate electrode layer. Also, the upper and lower gate electrode layers can have respective multiple-layers composed of conductive materials such as polysilicon, silicon germanium, metallic silicide, metal and so on. In a typical example, the upper gate electrode layer has a structure including a polysilicon layer and a silicide layer of cobalt silicide, nickel silicide and the like formed on the polysilicon layer. Also, another typical example is that a bottom portion of the lower gate electrode layer is made of semiconductor, semiconductor silicide, metallic nitride, metallic compound, metal and so on such as TiN, MoN, WN, platinum silicide, erbium silicide, silicon germanium mixed crystal, germanium and the like for the purpose of controlling gate work function. When the lower gate electrode layer is not made of polysilicon, the CMP mask (for example, indicated by numerals 205 and 206 in FIGS. 13 A to 13C) used in the CMP process is a multiple-layer film composed of a $Si_3N_4$ film as a top layer and a material layer other than polysilicon as a second layer under the top layer. Also, in the process shown in FIG. 17, the CMP mask is a multiple-layer film composed of a $SiO_2$ film as a top layer, a $Si_3N_4$ film as a second layer under the top layer and a material layer other than polysilicon as a third layer under the second layer.

Figure 18A:
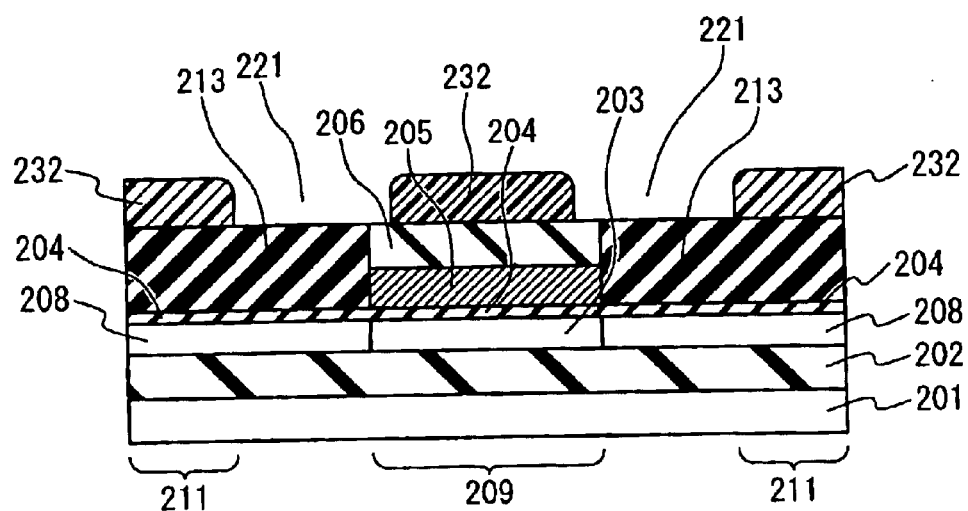
FIGS. 18A and 18B show still another method for manufacturing the SOI transistor according to the first embodiment of the present invention.
Figure 18B:
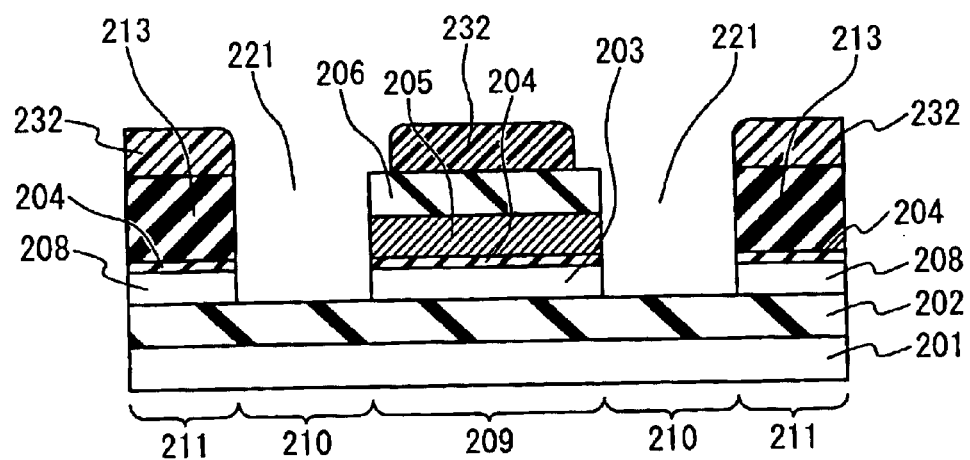

The process of removing the SOI layer 203 to form the full isolating region 210 (see FIGS. 11 and 12A to 12C) can be carried out at any stage after providing the transistor active region 209 (FIGS. 9 and 10A to 10C). FIGS. 18A and 18B show an example of the other method for forming the full isolating region 210. After forming the structure shown in FIGS. 10A to 10C, the field insulating film 213 is formed and then planarized through a CMP. After that, a resist pattern 232 having the opening area 221 indicated by a dashed rectangular in FIG. 9 is formed as shown in FIG. 18A. The field insulating film 213, the gate insulating film 204, and the SOI layer 203 are removed by using the resist pattern 232 and the $Si_3N_4$ film 206 as a mask to form the full isolating region 210, as shown in FIG. 18B. After that, an insulating film ($SiO_2$) is formed again through a CVD process, and a second CMP is carried out, to obtain the same structure as in FIG. 13B.

Figure 19A:
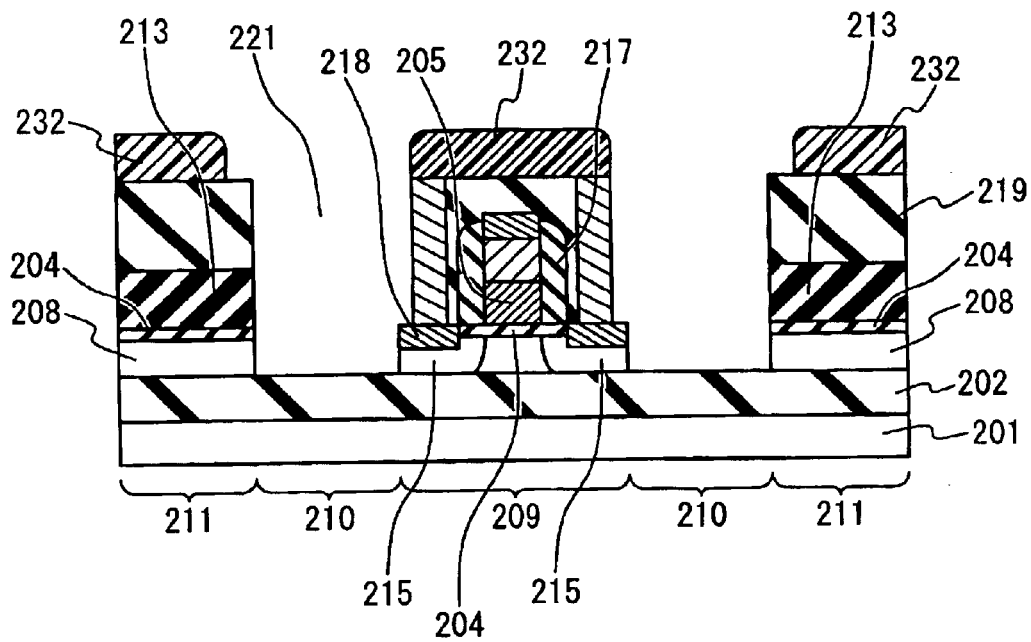
FIGS. 19A and 19B show still another method for manufacturing the SOI transistor according to the first embodiment of the present invention.
Figure 19B:
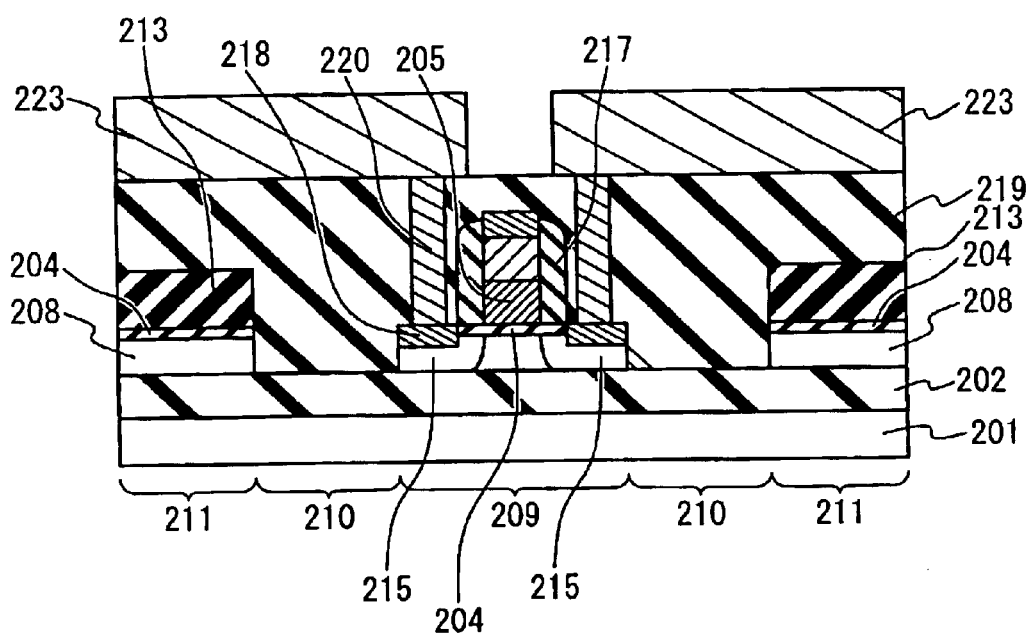

Similarly, FIGS. 19A and 19B show another example of the method for forming the full isolating region 210. After forming the source/drain regions 215, the silicide layers 218, the upper and lower gate electrode layers 205 and 214, and the gate side wall 217 in the transistor active region 209, the interlayer insulating film 219 is formed and then planarized through a CMP. After that, a resist pattern 232 having the opening area 221 indicated by a dashed rectangular in FIG. 9 is formed. The interlayer insulating film 219, the field insulating film 213, the gate insulating film 204, and the SOI layer 203 are removed by using the resist pattern 232 and the silicide layers 218 as a mask to form the full isolating region 210, as shown in FIG. 19A. The interlayer insulating film 219 is formed and planarized again. Then, the contacts 220 and the wirings 223 are formed, to obtain a structure as shown in FIG. 19B. In these manufacturing methods, the full isolating region 210 is formed after the formation and planarization of the field insulating film 213 or the interlayer insulating film 219, and the manufacturing methods have an advantage of an excellent resist pattern because the resist pattern 232 is formed on the planar surface.

Figure 20:
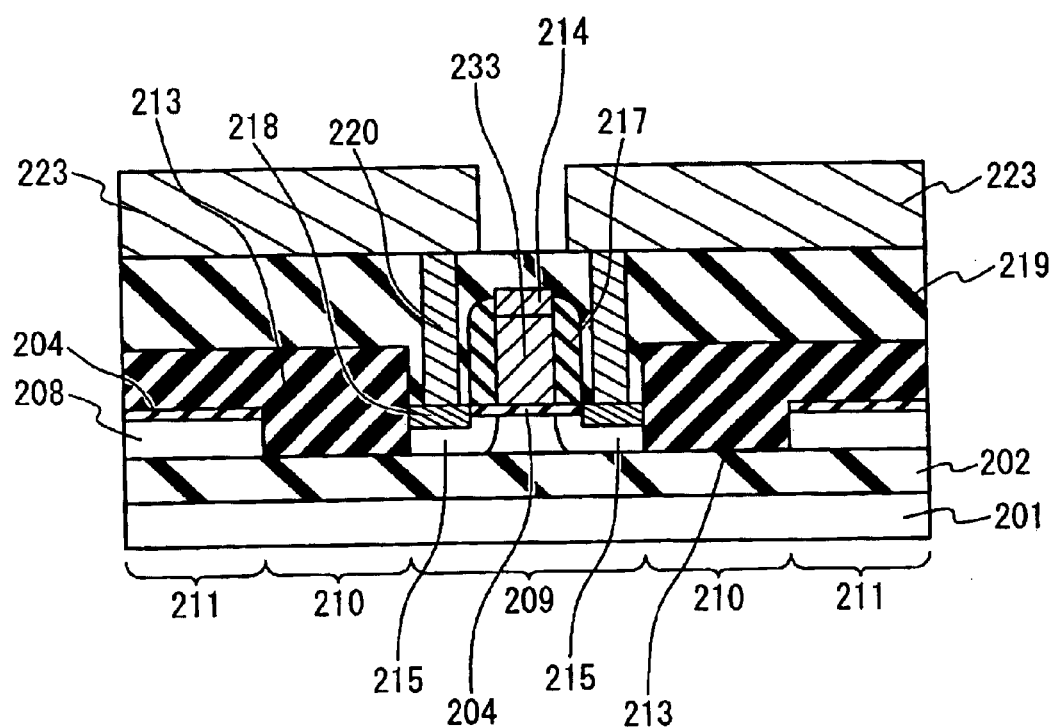
FIG. 20 shows another example of the structure of the SOI transistor according to the first embodiment of the present invention.

Also, the first polysilicon layer 205 can be removed after the structure shown in FIGS. 14A and 14B is obtained. Or, the first polysilicon layer 205 can be removed after the field insulating film 213 is planarized and then the $Si_3N_4$ film 206 and the field insulating film 213 is etched back. In this case, a new material for the gate electrode is deposited again and then processed to form the gate electrode 222. The formation of the second polysilicon layer 214 can be omitted. The first polysilicon layer 205 formed in the step shown in FIG. 8 is not used as the material for the gate electrode. Therefore, the first polysilicon layer 205 can be substituted by a layer of other material such as an insulating film. The double-layer of the polysilicon layer 205 and the $Si_3N_4$ film 206 in FIG. 8 can be substituted by a single-layer of the $Si_3N_4$ film 206. Moreover, before depositing the new material for the gate electrode, the gate insulating film 204 formed in FIG. 8 can be removed and then a new gate insulating film can be formed again. After all, the gate electrode of the accomplished transistor does not become the double-layer gate electrode as in FIG. 7B but becomes a single-layer gate electrode 233 as shown in FIG. 20.

Also, after the structure shown in FIGS. 14A and 14B is obtained and the second polysilicon layer 214 is formed on the first polysilicon layer 205, a new $Si_3N_4$ film can be formed on the second polysilicon layer 214. In this case, the polysilicon layers 205 and 214 are first processed in the similar way as in FIG. 16B. After that, the interlayer insulating film 219 is formed and then planarized through a CMP by using the new $Si_3N_4$ film as a mask. Then, the new $Si_3N_4$ film and the first and second polysilicon layers 205 and 214 are removed, to obtain a cavity within the interlayer insulating film 219. In addition to that, the gate insulating film 204 can be removed too. After that, a new gate electrode or a new gate insulating film and a new gate electrode are formed in the cavity. Also in this case, the gate electrode of the accomplished transistor does not become the double-layer gate electrode as in FIG. 7B but becomes a single-layer gate electrode 233 as shown in FIG. 20.

[Second Embodiment]

Figure 21:
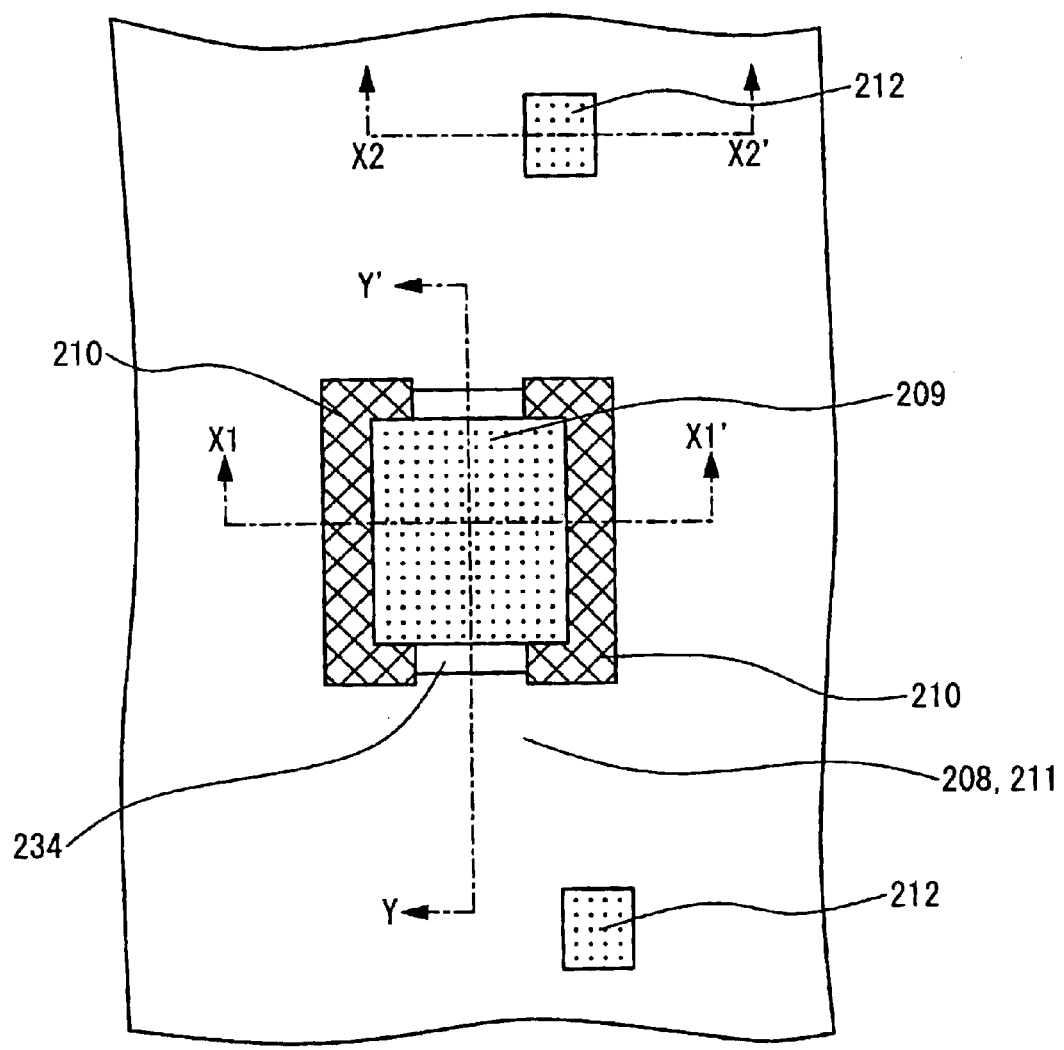
FIG. 21 is a plan view showing a structure of an SOI transistor according to a second embodiment of the present invention.
Figure 22A:
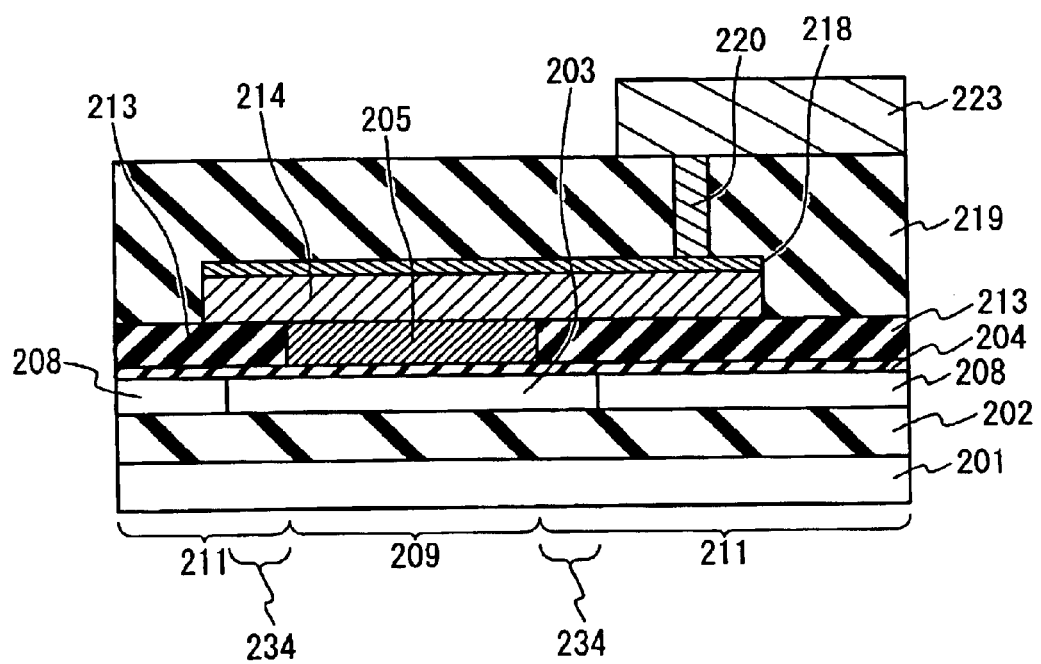
FIGS. 22A and 22B are cross sectional views along a dashed line Y–Y' in FIG. 21 showing examples of the SOI transistor according to the second embodiment of the present invention.
Figure 22B:
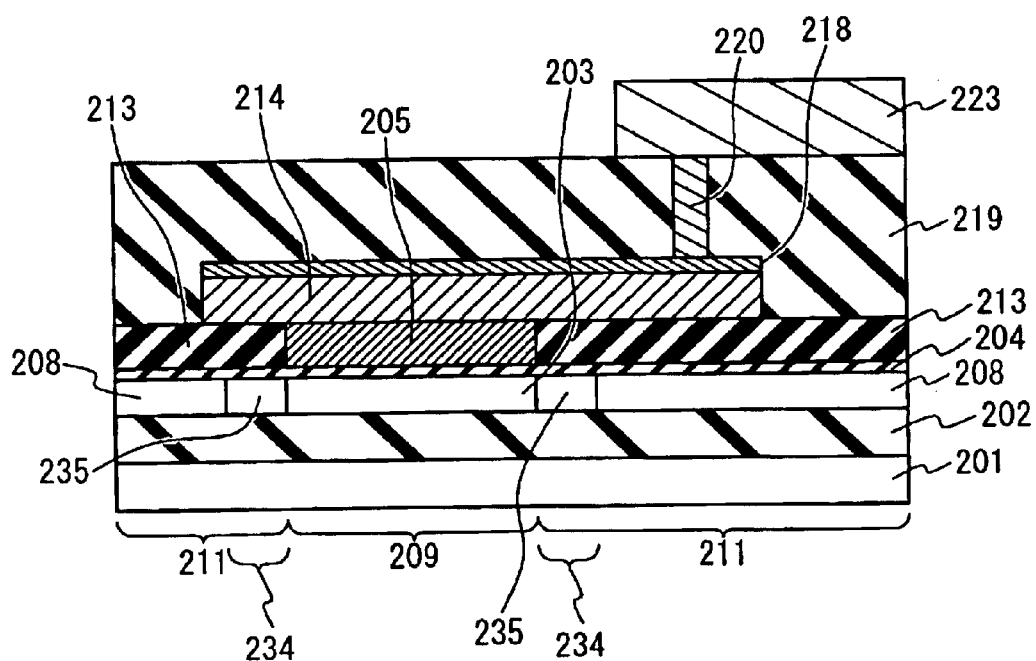

FIG. 21 is a plan view showing a structure of a semiconductor device according to a second embodiment of the present invention (corresponding to the structure in FIG. 11 according to the first embodiment). FIGS. 22A and 22B are cross sectional views along a dashed line Y–Y' in FIG. 21, showing two examples according to the present embodiment.

The structure in the present embodiment is essentially the same as that in the first embodiment, except for the partial isolating region 211. As shown in FIG. 21, a lightly doped region 234 is formed in the carrier path 208 next to the transistor active region 209, in which the impurity density is lower than that in the carrier path 208. The impurity density in the lightly doped region 234 can be higher and lower than that in the transistor active region 209. Therefore, when the impurity density in the transistor active region 209 is lower than that in the carrier path 208, the impurity density in the lightly doped region 234 can be the same as that in the transistor active region 209, as shown in FIG. 22A. FIG. 22B shows another example of the present embodiment, in which a lightly doped layer 235 is formed in the lightly doped region 234. The impurity density in the lightly doped layer 235 is lower than that in the carrier path 208 and is different from that in the transistor active region 209. The lightly doped region 234 is effective in reducing leak current and parasitic capacitance between the source/drain regions 215 in the transistor active region 209 and the carrier path 208 in the partial isolating region 211.

The lightly doped layer 235 can be formed by introducing the impurity in a predetermined region of the SOI layer 203 by the use of an appropriate resist pattern. It is also possible to set an opening of a photo resist for introducing the impurity to form the carrier path 208 apart from the transistor active region 209.

Figure 23A:
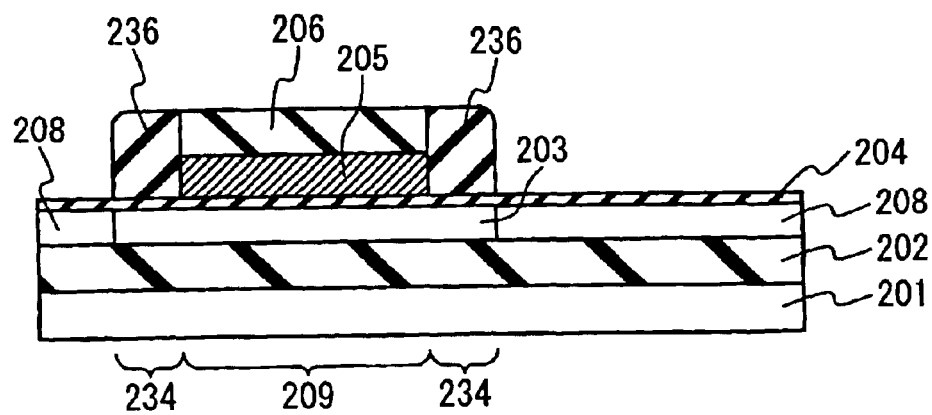
FIGS. 23A and 23B show a method for manufacturing the SOI transistor shown in FIGS. 22A and 22B, respectively.
Figure 23B:
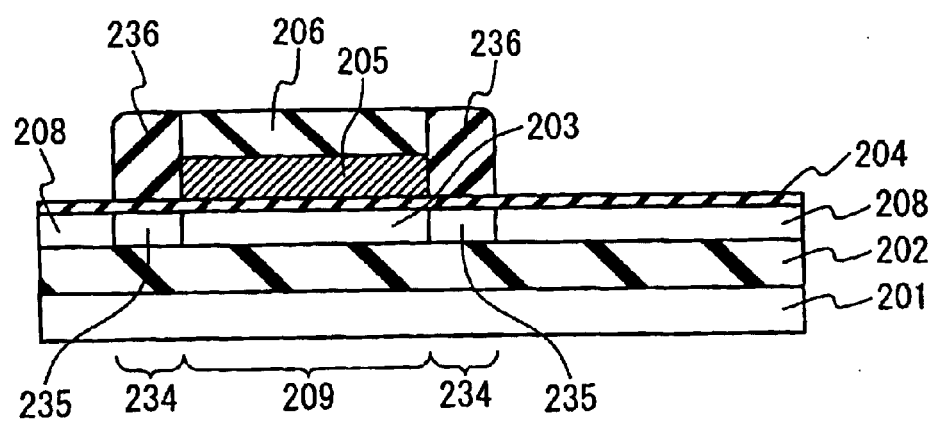

FIGS. 23A and 23B show other methods for manufacturing the semiconductor devices shown in FIGS. 22A and 22B, respectively. Both figures show a structure corresponding to the structure shown in FIG. 10A according to the first embodiment. The resist 207 in FIG. 10A is removed before introducing the impurity to form the carrier path 208. After that, a side wall 236 made of an insulating film such as $SiO_2$ is formed through a CVD process and an etch back process. Then, the carrier path 208 is formed by introducing the impurity through an ion implantation and the like by using the $Si_3N_4$ film 206 and the side wall 236 as a mask (see FIGS. 22A and 23A). Also, it is possible to introduce the impurity into the SOI layer 203 through an ion implantation and the like to form the lightly doped layer 235 by the use of the $Si_3N_4$ film 206 as a mask, before forming the side wall 236. After that, the side wall 236 is formed and then the impurity is introduced to form the carrier path 208 (see FIGS. 22B and 23B). In any case, the transistor active region 209 and the carrier path 208 can be formed to be exclusive with each other as in the first embodiment, which is one of characteristics of the present embodiment. When manufacturing a CMOS (Complementary Metal Oxide Semiconductor), the lightly doped layer 235 and the carrier path 208 are formed differently in an n-channel transistor and a p-channel transistor. In this case, the impurity is introduced into one transistor, while the other transistor is covered with a resist mask. It should be noted that the side wall 236 can be made of other materials such as $Si_3N_4$ film, amorphous carbon, amorphous carbon fluoride, BCB (benzocyclobutene) and so on.

[Third Embodiment]

In the first and the second embodiment, the full isolating region 210 is formed contiguous not only to two sides of the source/drain regions 215 parallel to the dashed line Y–Y' but also to a part of two sides of the transistor active region 209 parallel to the dashed line X1–X1' (see FIGS. 6 and 21). However, it is also possible to form the full isolating region 210 contiguous to at least a part of sides of the source/drain regions 215.

Figure 24A:
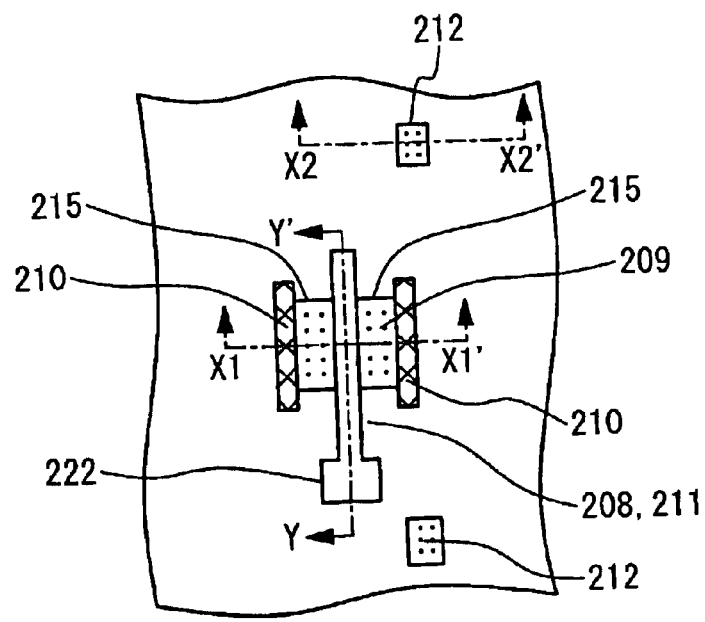
FIGS. 24A and 24B show examples of an SOI transistor according to a third embodiment of the present invention.
Figure 24B:
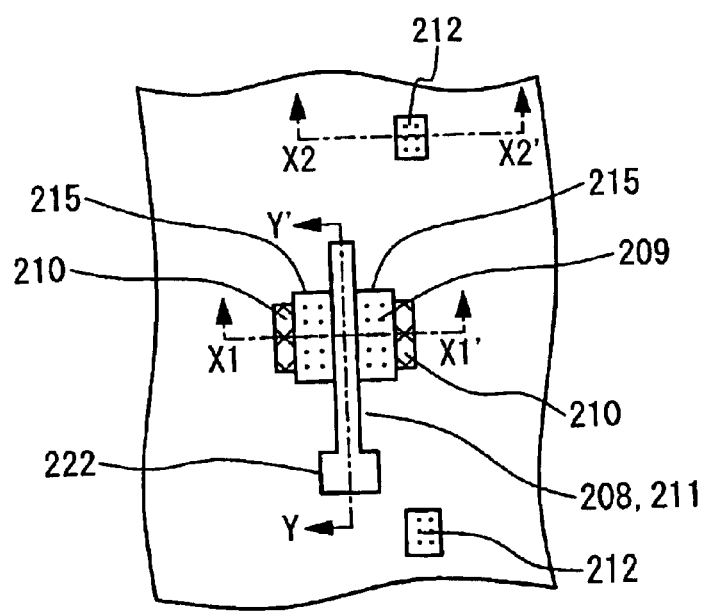

FIGS. 24A and 24B show examples of such a semiconductor device according to a third embodiment of the present invention. In FIG. 24A, for example, the full isolating region 210 (indicated by a heavily hatched area) is formed contiguous only to a first side of the source region 215 parallel to the dashed line Y–Y' and a second side of the drain region 215 parallel to the dashed line Y–Y'. In FIG. 24B, the full isolating region 210 is formed contiguous to only a part of the first and second sides of the source/drain regions 215 parallel to the dashed line Y–Y'.

The leak current and the parasitic capacitance between the transistor active region 209 and the carrier path 208 are inversely proportional to length of the sides of the transistor active region 209 (source/drain regions 215) to which the full isolating region 210 is contiguous. Therefore, the larger the area of the sides of the transistor active region 209 contiguous to the full isolating region 210 becomes, the more the leak current and the parasitic capacitance are reduced. In particular, the leak current and the parasitic capacitance are reduced effectively, when more than half of the first and second sides of the source/drain regions 215 parallel to the dashed line Y–Y' is contiguous to the full isolating region 210. Also, the full isolating region 210 can be formed contiguous to a part of only one side of the source/drain regions 215 parallel to the dashed line Y–Y'. In this case, another side of the source/drain regions 215 is not contiguous to the full isolating region 210. In particular, the present invention is still effective even when the full isolating region 210 is formed only on the second side of the drain region 215. It should be noted that, in the present embodiment, the lightly doped region 234 can be formed as in the second embodiment.

[Fourth Embodiment]

Figure 25A:
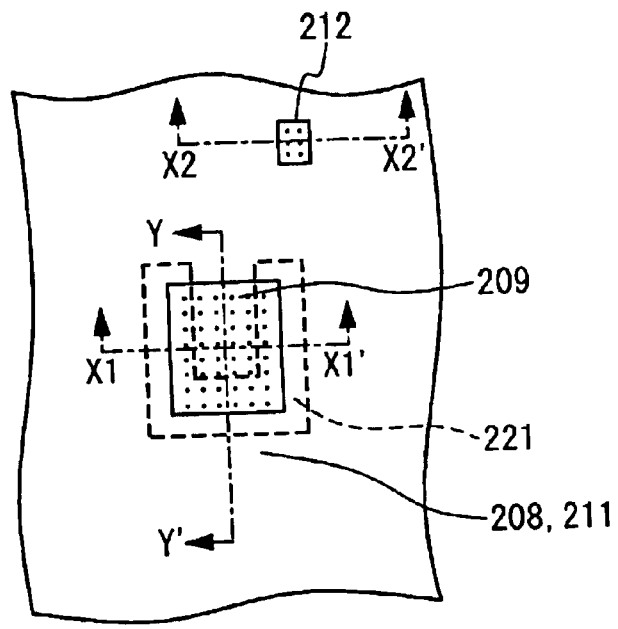
FIGS. 25A and 25B are plan views showing a structure of an SOI transistor according to a fourth embodiment of the present invention.
Figure 25B:
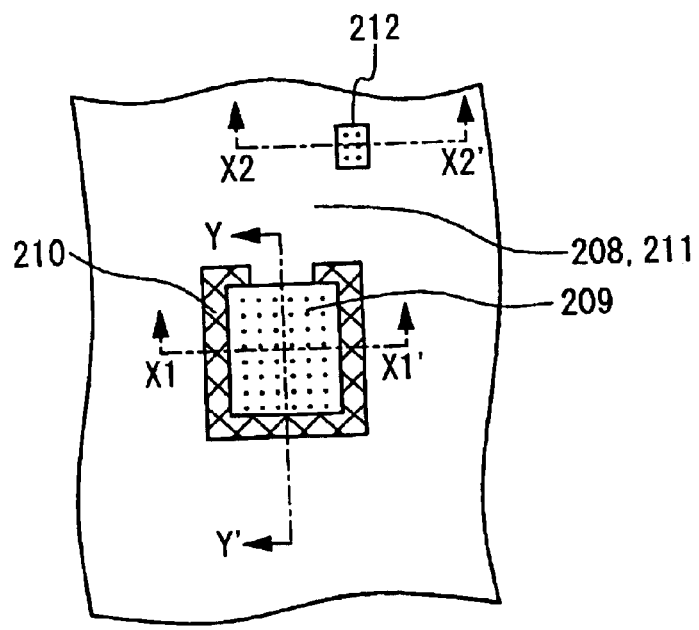

FIGS. 25A and 25B show a structure of a semiconductor device according to a fourth embodiment of the present invention. FIGS. 25A and 25B are plan views corresponding to FIGS. 9 and 11 in the first embodiment, respectively. As shown in FIG. 25A, in the present embodiment, an opening area 221 can be provided in "U" shape. Thus, the full isolating region 210 (indicated by a heavily hatched area) can be formed to be contiguous further to whole area of one side of the transistor active region 209 parallel to a dashed line X1–X1', as shown in FIG. 25B. The transistor active region 209 is connected to the body contact region 212 through the carrier path 208 contacting another side of the transistor active region 209 parallel to the dashed line X1–X1'.

Figure 26A:
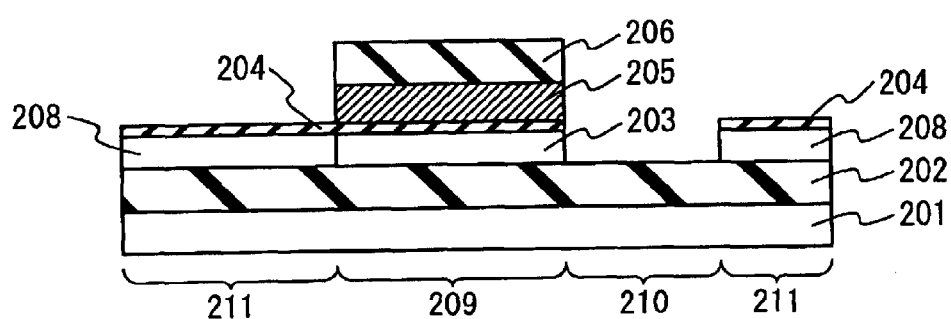
FIGS. 26A and 26B are cross sectional views showing the structure of the SOI transistor according to the fourth embodiment of the present invention.
Figure 26B:
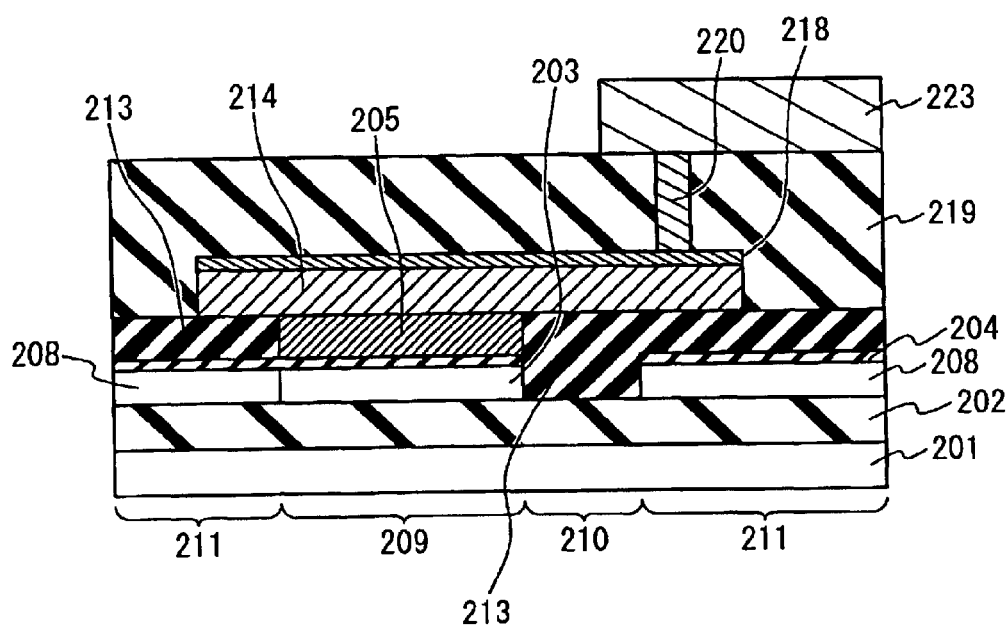

FIG. 26A is a cross sectional view along a dashed line Y–Y' in FIG. 25B. FIG. 26B is a cross sectional view showing a structure of the completed semiconductor device according to the present embodiment (corresponding to the structure shown in FIG. 7A according to the first embodiment). As shown in FIG. 26B, the channel region in the transistor active region 209 is exposed to the full isolating region 210 on a side parallel to the dashed line X1–X1' in FIG. 25B. It may be possible to add a process before depositing the field insulating film 213 (see FIG. 26A) that modifies the property of the side of the transistor active region 209 through a thermal oxidation process and hence reduces the interface state.

[Fifth Embodiment]

Figure 27A:
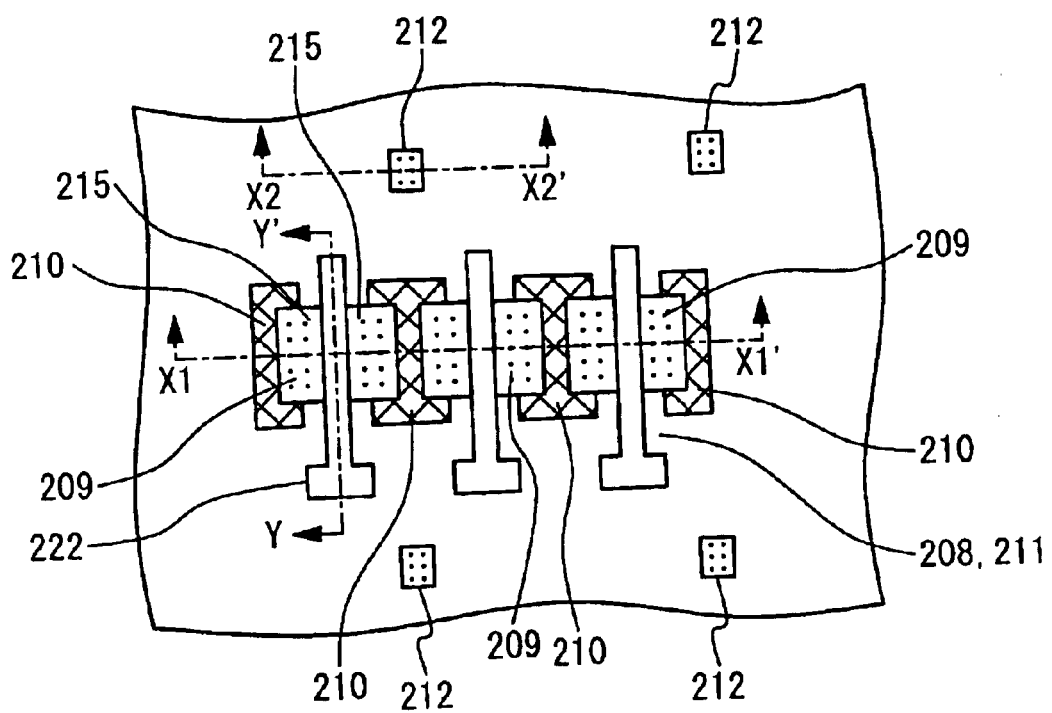
FIG. 27A is a plan view showing a structure of an SOI transistor according to a fifth embodiment of the present invention.
Figure 27B:
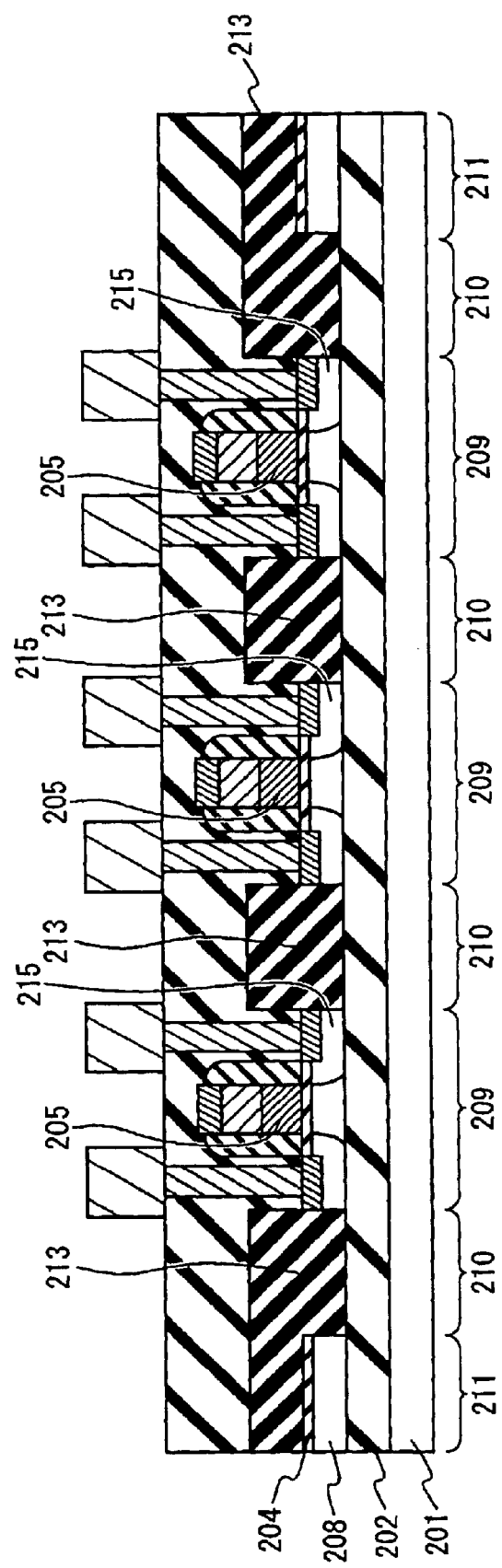
FIG. 27B is a cross sectional view along a dashed line X1–X1' in FIG. 27A.

FIG. 27A is a plan view showing a structure of a semiconductor device according to a fifth embodiment of the present invention. FIG. 27B is a cross sectional view along a dashed line X1–X1' in FIG. 27A. In the present embodiment, the semiconductor device includes a plurality of SOI transistors (a plurality of transistor active regions 209), each of which is similar to the SOI transistor described in the previous (first to fourth) embodiments. In this case, the plurality of SOI transistors are disposed next to each other, and only the full isolating region 210 exists between two adjacent transistor active regions 209 (source/drain regions).

[Sixth Embodiment]

A semiconductor device according to a sixth embodiment of the present invention will be described with reference to FIGS. 28A to 28G. In the semiconductor devices described in the first to fifth embodiments, the transistor active region 209 should be connected to at least one body contact region 212 through the carrier path 208. A unit structure composed of a transistor active region (SOI transistor) and a body contact region can be isolated by the full isolating region (a block isolating film) 210 as shown in FIGS. 28A to 28G. The unit structure isolated by the full isolating region 210 can be composed of a plurality of transistor active regions 209 and one body contact region 212. The unit structure can be composed of one transistor active region 209 and a plurality of body contact regions 212 (see FIGS. 28B and 28C). The unit structure can be composed of a plurality of transistor active regions 209 and a plurality of body contact regions 212 (see FIGS. 28A and 28D).

Figure 28A:
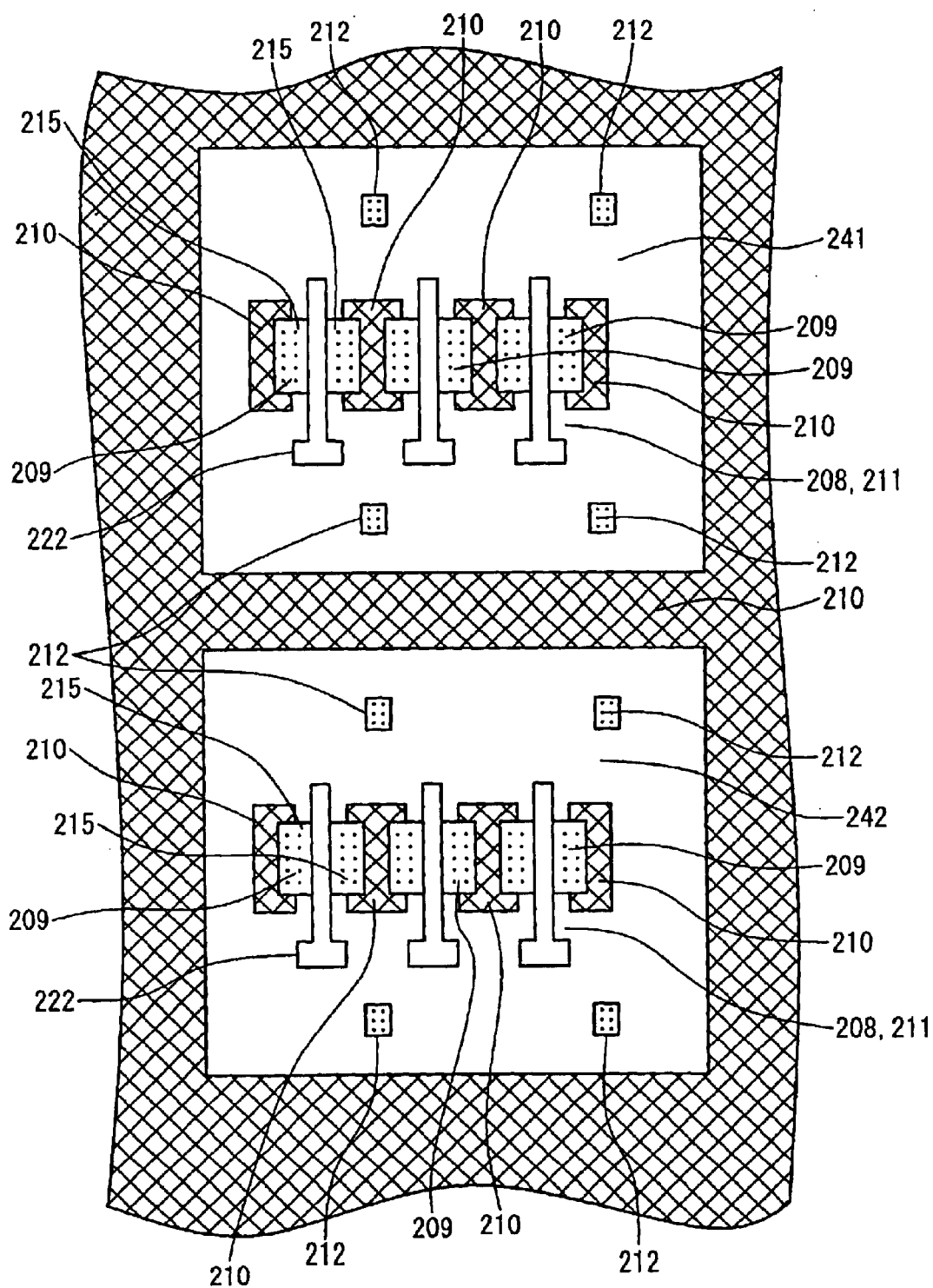
FIGS. 28A to 28G are plan views showing examples of a semiconductor device according to a sixth embodiment of the present invention.
Figure 28B:
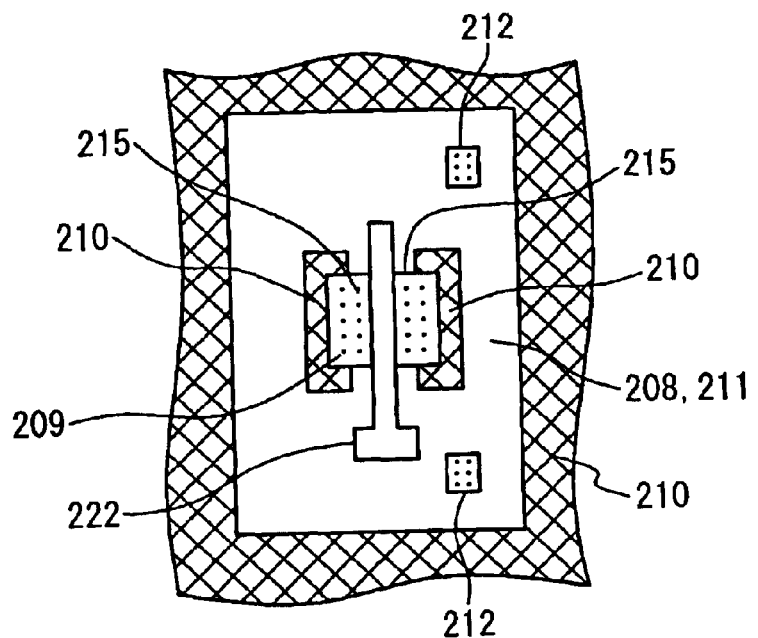
Figure 28C:
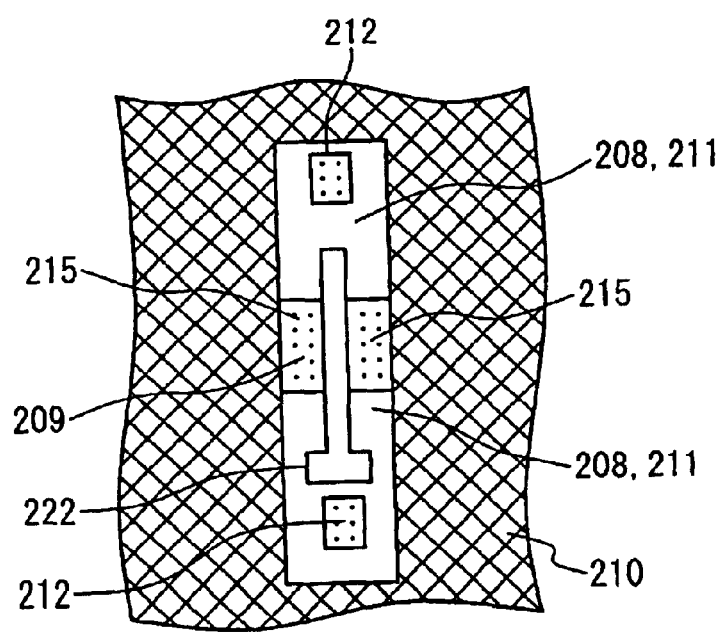
Figure 28D:
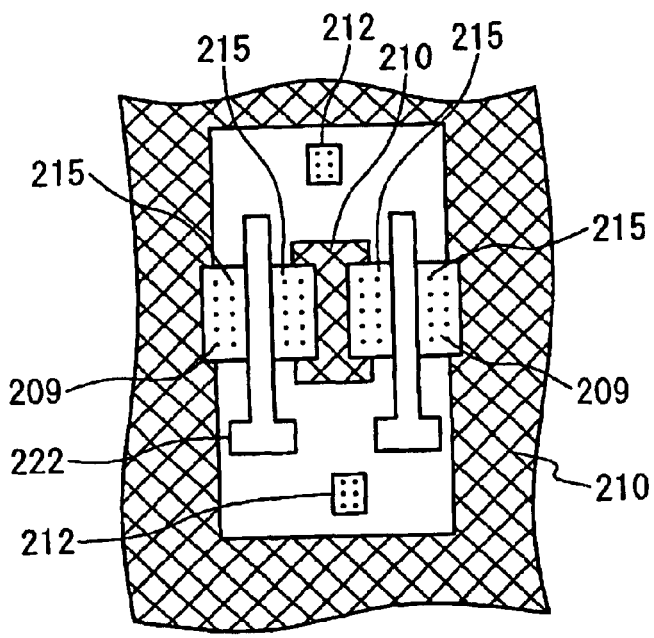
Figure 28E:
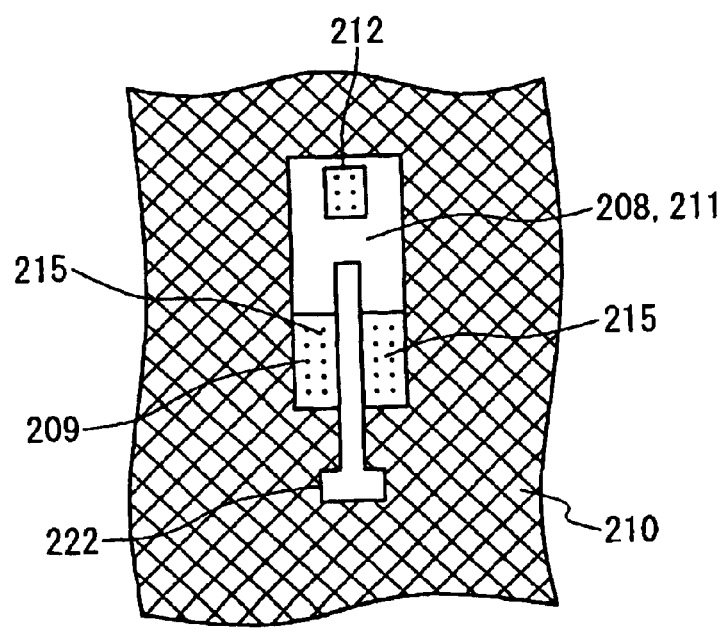
Figure 28F:
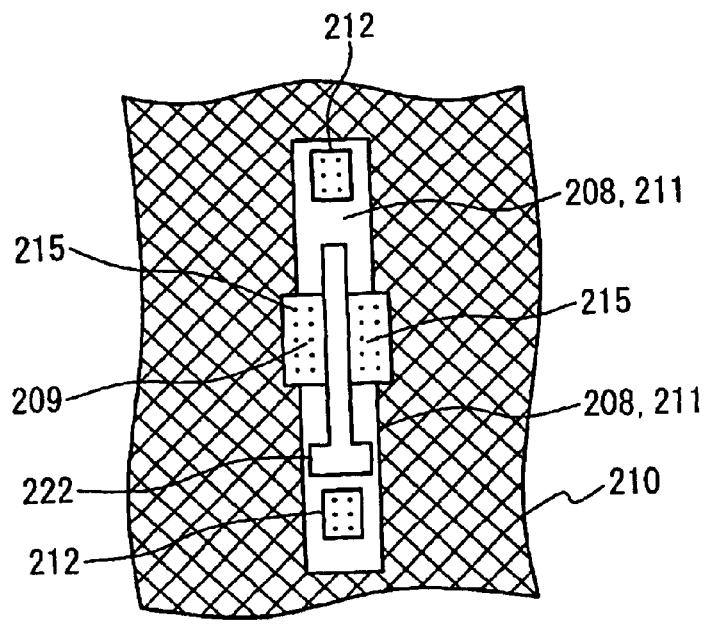
Figure 28G:
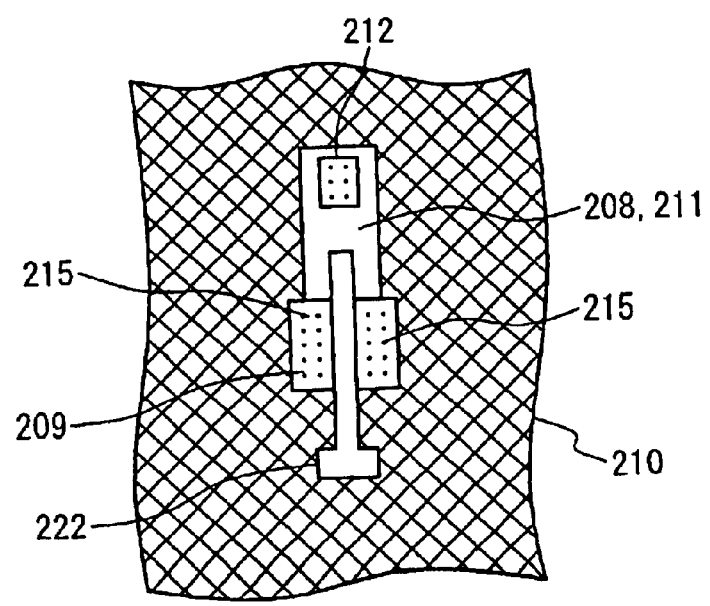

In the present embodiment, a plurality of FET transistors can be formed within one block surrounded by the full isolating region (a block isolating film) 210 as shown in FIG. 28A. An n-channel transistor and a p-channel transistor can be formed in respective blocks surrounded by the full isolating region 210. Also, a plurality of n-channel transistors and a plurality of p-channel transistors can be formed in respective blocks surrounded by the full isolating region 210 (see FIG. 28A). For example, blocks 241 and 242 in FIG. 28A can be for the plurality of n-channel transistors and the plurality of p-channel transistors, respectively. A part of the full isolating region 210 can be formed contiguous to a side of the source/drain regions 215 to determine the block containing a plurality of transistors (see FIG. 28D). Also, a part of the full isolating region 210 which determines the block containing one transistor can be formed contiguous to a side of the source/drain regions 215 (see FIGS. 28C, 28E, 28F and 28G). Also, one block surrounded by the full isolating region 210 can contain an n-channel transistor and a p-channel transistor together, if the separation between the n-channel transistor and the p-channel transistor is enough to avoid a short circuit in the carrier paths in the both transistors. It should be noted that an arbitrary positional relationship is possible between the gate electrode 222 and the body contact region 212. That is to say, the body contact region 212 may or may not be located on the extension of the gate electrode 222.

[Modifications]

Modifications of the present invention will be described below, which can be adopted in any one of the above-mentioned embodiments. The buried insulating film 202, normally made of $SiO_2$, may be made of other insulators such as $Si_3N_4$ and porous $SiO_2$. Also, a cavity can be formed in the buried insulating film 202. Also, the buried insulating film 202 can be multi-layer film composed of a plurality of insulators. For example, the buried insulating film 202 can be double-layer film composed of a top $Si_3N_4$ layer and a bottom $SiO_2$ layer, or can be triple-layer film composed of a top $SiO_2$ film, a middle $Si_3N_4$ film and a bottom $SiO_2$ film. The thickness of the buried insulating film 202 is generally in a range from 80 nm to 1 $\mu$m. However, the thickness can be out of this range.

Figure 1A:
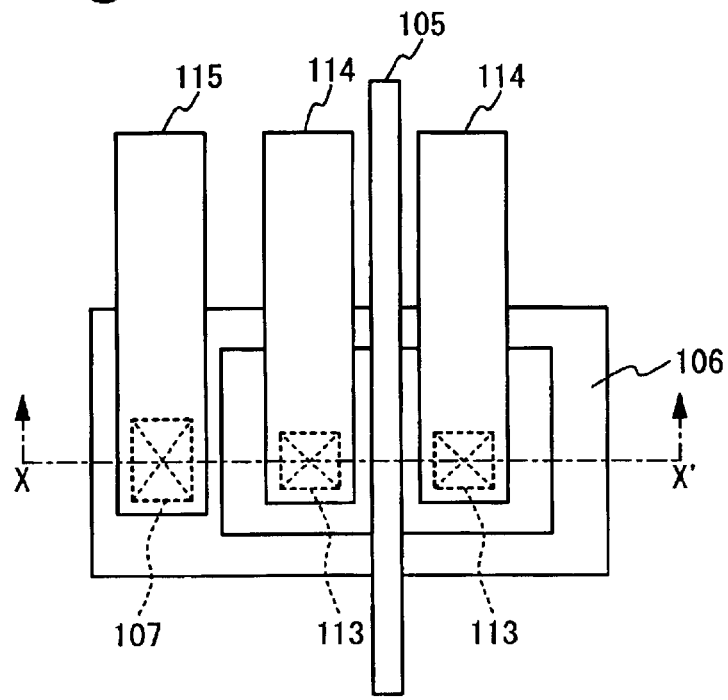
FIG. 1A is a plan view showing a structure of a conventional SOI transistor.
Figure 1B:
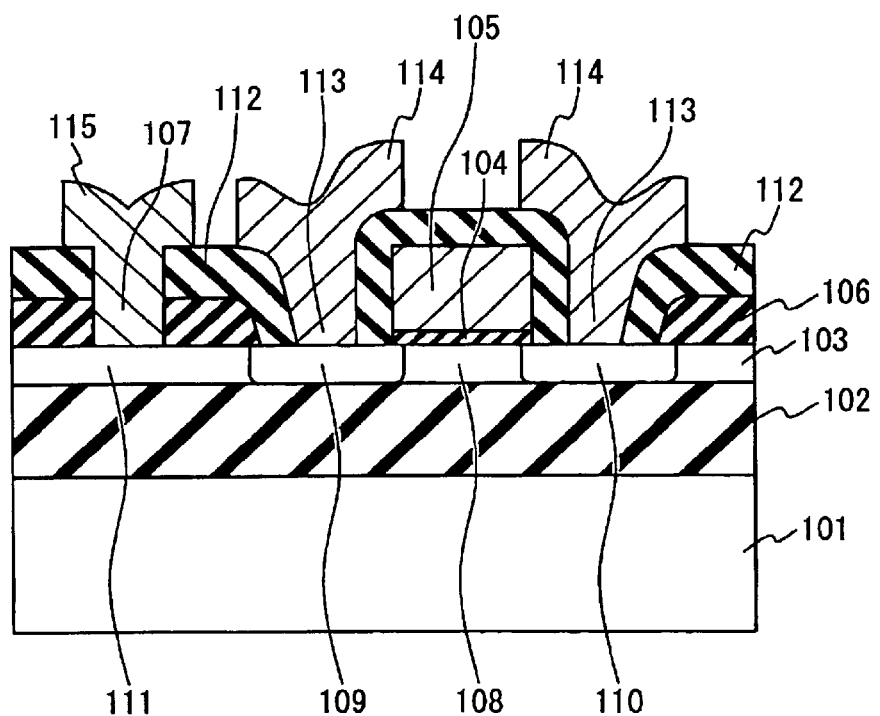
FIG. 1B is a cross sectional view along a dotted line X–X' in FIG. 1A.

The SOI substrate may not have the substrate. That is to say, the SOI substrate may have a structure including only an insulating film and a semiconductor layer on the insulating film, such as an SOS (Silicon on Sapphire) substrate and a semiconductor layer on a glass substrate. Also, instead of the SOI layer 203, a semiconductor layer made of other than silicon can be used. Also, a combination of more than two kinds of semiconductors is possible for the semiconductor layer. The thickness of the SOI layer 203 in a full-depletion SOI MOSFET is typically in a range from 10 nm to 50 nm. The SOI layer 203 can be thicker in cases of partial-depletion SOI MOSFET and a transistor with a long gate length (typically more than 0.35 $\mu$m). Also, the SOI layer 203 can be thinner in a case where the gate length is short and the short channel effect is to be restrained. It should be noted that when the material and size of the structures in FIG. 1 are changed, the corresponding structures in the following processes should be considered to have the similar change in the material and the region. Also, when the material and size of the structures in a figure other than FIG. 1 are changed, the corresponding structures in the following processes should be considered to have the similar change in the material and the region.

An impurity density in the surface of the SOI layer 203 in both the source/drain region and the body contact region is typically in a range from $5\times10^{18}$ cm$^{-3}$ to $1\times10^{21}$ cm$^{-3}$, and more typically in a range from $3\times10^{19}$ cm$^{-3}$ to $1\times10^{20}$ cm$^{-3}$. The impurity is introduced by ion implantation or vapor-phase diffusion. The dose at the time of the ion implantation is typically in a range from $1\times10^{14}$ cm$^{-2}$ to $3\times10^{15}$ cm$^{-2}$, and more typically in a range from $3\times10^{14}$ cm$^{-2}$ to $1\times10^{15}$ cm$^{-2}$.

The impurity which is to be introduced to the source/drain regions 215 should have n-type conductivity type in a case of an n-channel transistor, and have p-type conductivity type in a case of a p-channel transistor. The impurity which is to be introduced to the body contact region 212 and the partial isolating region 211 (carrier path 208) should have p-type conductivity type in a case where the regions are connected to an n-channel transistor, and have n-type conductivity type in a case where the regions are connected to an p-channel transistor. As a result, the source/drain regions 215 in the n-channel transistor and the p-channel transistor are formed to be n-type and p-type, respectively. The body contact region 212 and the carrier path 208 connected to the n-channel transistor and those connected to the p-channel transistor are formed to be p-type and n-type, respectively.

In the ion implantation process in any of the above-mentioned embodiments, ion species such as $B^+$, $BF_2^+$ and $In^+$ are used for forming the p-type region (including $p^+$-type and $p^-$-type). Also, ion species such as $As^+$, $P^+$ and $Sb^+$ are used for forming the n-type region (including $n^+$-type and $n^-$-type). It is also possible to use any other ions with which the p-type region or the n-type region can be formed. The ion species is not limited to such ion species having monovalent charge as mentioned above, but can have divalent charges or more. It is also possible to implant a cluster composed of impurity with respective conductivity types. Also, the ion implantation can be replaced with another impurity introducing method such as plasma doping, vapor-phase diffusion, solid-phase diffusion and so forth.

The gate insulating film 204, which is formed by thermal oxidation of silicon in the above-mentioned embodiments of the present invention, can be replaced with a $SiO_2$ film formed by other methods such as radical oxidation method for example. Also, the gate insulating film 204 can be replaced with an insulating film other than a $SiO_2$ film. Also, the gate insulating film 204 can be replaced with a multi-layer film composed of a $SiO_2$ film and another insulating film or a multi-layer film composed of other insulating films. Also, the gate insulating film 204 can be replaced with a material with high dielectric constant such as $Ta_2O_5$ and the like. Such a gate insulating film is preferable because parasitic capacitance between the gate and the semiconductor layer in the isolating region becomes relatively lower than the gate capacitance, if the dielectric constant of the gate insulating film 204 is higher than that of the field insulating film 213. The gate insulating film 204 can be a laminated film or a film whose composition varies in the vertical direction. Such a gate insulating film is also preferable because parasitic capacitance between the gate and the semiconductor layer in the isolating region becomes relatively lower than the gate capacitance, if the dielectric constant of a part of the gate insulating film 204 is higher than that of the field insulating film 213.

The ion energy in the ion implantation process is typically in a range from 0.5 KeV to 20 KeV. Here, the ion energy can be lower in a case when the impurity is particularly desired to be distributed in a shallow region of the SOI layer 203. Also, the ion energy can be higher in a case when the impurity is desired to be distributed in a deep region of the SOI layer 203, for example, in a case when the SOI layer 203 is thick. The activation of the impurity introduced through the ion implantation is carried out by a heating process such as annealing by a normal electric furnace or lamp annealing.

When the impurity is introduced into the channel region in any of the above-mentioned embodiments, the ion implantation is carried out after forming a sacrificial oxide film. A heating process for activating the implanted ion can be carried out immediately after the ion implantation or can be carried out together with a heating process for activating the impurity introduced into the source/drain region. The impurity density is typically in a range from 0 to $2\times10^{18}$ cm$^{-3}$ when the thickness of the SOI layer 203 is 50 nm. The typical density can be in a lower range when the SOI layer 203 is thicker than 50 nm and can be in a higher range when the SOI layer 203 is thinner than 50 nm. For example, when the SOI layer 203 is 10 nm thick, the impurity density is typically in a range from 0 to $5\times10^{18}$ cm$^{-3}$. Also, the different density can be possible if it is necessary to meet the requirement from the setting the threshold voltage. Also, when a material other than polysilicon is used for the gate electrode, the setting of the threshold voltage is independent of the introduction of the impurity. Therefore, the introduction of the impurity can be omitted.

When the material of the gate electrode is a semiconductor such as polysilicon-germanium mixed crystal and the like, the impurity can be introduced into the gate at the same time when the impurity is introduce into the source/drain region or the material of the gate electrode is deposited. Also, the impurity can be introduced into the gate after depositing the material of the gate electrode and before processing the material to form the gate electrode.

If the impurity is introduced into the material of the gate electrode before forming the gate electrode in manufacturing a CMOS, and if the conductivity type of the gate electrode of an n-channel transistor is different from that of a p-channel transistor, the impurities can be introduced by using an appropriate resist mask into respective regions where the n-channel and the p-channel transistors are to be formed. Here, the impurities have respective conductivity types. Generally, the gate of the n-channel transistor includes the n-type impurity and the gate of the p-channel transistor includes the p-type impurity. The optimum etching condition for forming the gate electrode may differ depending on the conductivity type (n-type or p-type) of the impurity which is introduced into the material of the gate electrode. In this case, forming the gate electrode of the n-channel transistor and forming the gate electrode of the p-channel transistor can be carried out in a different process by using an appropriate resist mask.

The impurity can be introduced into the gate electrode before etching the deposited material of the gate electrode through RIE to form the gate electrode or after the etching process or before and after the etching process. The material of the gate electrode should have the appropriate conductivity type and the work function necessary for setting the threshold voltage of the transistor. The material of the upper gate electrode layer should have the appropriate conductivity type.

A silicon layer (SOI layer) is used as the semiconductor layer in the above-mentioned embodiments of the present invention. The semiconductor layer can be made of a material other than silicon. Also, the semiconductor layer can be made of a combination of silicon and a material other than silicon.

It is preferable that the SOI layers 203 in the transistor active region 209, the carrier path 208 and the body contact region 212 have substantially the same thickness. The difference in the thickness of the SOI layer 203 between the three regions should be a minute difference caused unavoidably in the manufacturing processes such as gate oxidation and etching of the insulating ($SiO_2$) film on the SOI layer 203. No intended process is included in the present invention, in which any one of the SOI layers 203 of the transistor active region 209, the carrier path 208 and the body contact region 212 is formed to be thinner than the others.

From the viewpoint of the ion implantation, it is preferable not to amorphize the whole SOI layer 203. That is to say, it is preferable that the implanted ion does not distribute all over the thickness of the SOI layer 203. Therefore, the ion injection energy is controlled such that the ion penetrates into less than 70–80% of the thickness of the SOI layer 203.

Also, it is preferable that the top of the gate electrode on the transistor active region 209 is substantially aligned with that on the partial isolating region 211. From the viewpoint of the stability of lithography process and gate etching process, the step is preferably within 40 nm, and more preferably within 20 nm. In order to attain the predetermined step, it is preferable to control the CMP condition and the thickness of the material of the gate electrode.

It will be obvious to one skilled in the art that the present invention may be practiced in other embodiments that depart from the above-described specific details. The scope of the present invention, therefore, should be determined by the following claims.

What is claimed is:

1. A semiconductor device comprising:
   a field effect transistor including:
      a semiconductor layer formed on an insulator;
      a gate insulating film formed on said semiconductor layer;
      a gate electrode formed on said gate insulating film and extending in a first direction; and
      source/drain regions formed in said semiconductor layer on both sides of said gate electrode by heavily introducing a first conductivity type impurity;
   a body contact region in which a second conductivity type impurity is heavily introduced into said semiconductor layer;
   a partial isolating region in which a field insulating film thicker than said gate insulating film intervenes between said semiconductor layer and an extending portion of said gate electrode, and an impurity with the same conductivity type as said body contact region is introduced into said semiconductor layer; and
   a full isolating region in which said semiconductor layer on said insulator is removed,
   wherein said full isolating region is formed to be in contact with at least a part of a side parallel to said first direction of said source/drain regions of said field effect transistor.

2. The semiconductor device according to claim 1, wherein said gate electrode comprises:
   a first gate electrode layer having substantially a same thickness as said field insulating film; and
   a second gate electrode layer formed on said first gate electrode layer and extending over a carrier path.

3. The semiconductor device according to claim 2, wherein said first gate electrode layer and said second gate electrode layer are made of a material deposited in different processes.

4. The semiconductor device according to claim 3, wherein said first gate electrode layer and said second gate electrode layer are made of different materials.

5. The semiconductor device according to claim 1, wherein an impurity density in said semiconductor layer in a part of said partial isolating region contiguous to a device region in which said field effect transistor is provided is lower than an impurity density in said semiconductor layer in the other part of said partial isolating region.

6. The semiconductor device according to claim 1, wherein an impurity density in said semiconductor layer in a part of said partial isolating region contiguous to a device region in which said field effect transistor is provided is lower than an impurity density in said semiconductor layer in the other part of said partial isolating region and is the same as an impurity density in said semiconductor layer in said device region.

7. The semiconductor device according to claim 2, wherein an impurity density in said semiconductor layer in a part of said partial isolating region contiguous to a device region in which said field effect transistor is provided is lower than an impurity density in said semiconductor layer in the other part of said partial isolating region and is the same as an impurity density in said semiconductor layer in said device region.

8. The semiconductor device according to claim 1, wherein said full isolating region is formed to be in contact with the whole sides parallel to said first direction of said source/drain regions of said field effect transistor.

9. The semiconductor device according to claim 1, wherein said full isolating region is formed to be in contact with the whole sides parallel to said first direction of said source/drain regions of said field effect transistor and a part of a side perpendicular to said first direction of said source/drain regions.

10. The semiconductor device according to claim 1, wherein only said full isolating region is provided between adjacent said field effect transistors.

11. The semiconductor device according to claim 1, wherein said full isolating region is formed to be in contact with a part of a side parallel to said first direction of said source/drain regions of said field effect transistor and the whole of one side perpendicular to said first direction of said source/drain regions.

12. The semiconductor device according to claim 1, wherein a plurality of said field effect transistors are provided in one block surrounded by said full isolating region.

13. The semiconductor device according to claim 1, wherein a p-channel type said field effect transistor and a n-channel type said field effect transistor are provided in different blocks surrounded by said full isolating region, respectively.

14. The semiconductor device according to claim 1, wherein a plurality of p-channel type said field effect transistors and a plurality of n-channel type said field effect transistors are provided in different blocks surrounded by said full isolating region, respectively.

15. The semiconductor device according to claim 1, wherein said full isolating region defining a block including a plurality of said field effect transistors is formed to be in contact with a side of said source/drain regions.

16. The semiconductor device according to claim 1, wherein said full isolating region defining a block including one said field effect transistor is formed to be in contact with a side of said source/drain regions.

17. A semiconductor device which has a transistor, comprising:

a semiconductor layer formed on an insulating film;

an active region formed in said semiconductor layer, said active region including a source region, a drain region and a channel region between said source region and said drain region;

a gate electrode formed over said channel region and extending in a first direction;

a body contact region formed in said semiconductor layer apart from said active region;

a carrier path formed in said semiconductor layer to connect said active region and said body contact region;

a first isolating region formed on said insulating film to be in contact with at least one of a first side of said source region parallel to said first direction and a second side of said drain region parallel to said first direction; and a second isolating region extending from said first isolating region over said carrier path, wherein said semiconductor layer in said carrier path has substantially a same thickness as said semiconductor layers in said active region and said body contact region.

* * * * *